(12) United States Patent
Divakaruni et al.

(10) Patent No.: US 7,030,012 B2
(45) Date of Patent: Apr. 18, 2006

(54) METHOD FOR MANUFACTURING TUNGSTEN/POLYSILICON WORD LINE STRUCTURE IN VERTICAL DRAM

(75) Inventors: Ramachandra Divakaruni, Ossining, NY (US); Oleg Gluschenkov, Poughkeepsie, NY (US); Oh-Jung Kwon, Hopewell Junction, NY (US); Rajeev Malik, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 60 days.

(21) Appl. No.: 10/708,530

(22) Filed: Mar. 10, 2004

(65) Prior Publication Data
US 2005/0202672 A1 Sep. 15, 2005

(51) Int. Cl.
*H01L 21/44* (2006.01)
(52) U.S. Cl. ...................... 438/652; 438/241
(58) Field of Classification Search ................ 438/239, 438/241, 253, 592, 652
See application file for complete search history.

(56) References Cited

U.S. PATENT DOCUMENTS

| 5,843,821 | A  | * | 12/1998 | Tseng ..................... 438/253 |
| 6,074,908 | A  | * | 6/2000 | Huang ..................... 438/241 |
| 6,200,834 | B1 | * | 3/2001 | Bronner et al. ........... 438/142 |
| 6,326,260 | B1 |   | 12/2001 | Divakaruni et al. |
| 6,346,734 | B1 |   | 2/2002 | Divakaruni et al. |
| 6,475,893 | B1 |   | 11/2002 | Giewont et al. |
| 6,541,810 | B1 |   | 4/2003 | Divakaruni et al. |
| 6,610,573 | B1 | * | 8/2003 | Weis ..................... 438/268 |
| 6,620,676 | B1 |   | 9/2003 | Malik et al. |
| 6,620,677 | B1 |   | 9/2003 | Hummler |
| 2002/0196651 | A1 |  | 12/2002 | Weis |

OTHER PUBLICATIONS

Divakaruni et al. "Gate Prespacers for High Density DRAMS" International Symposium on VLSI Technology Systems and Applications, Taipei, Taiwan (Jun. 8-10, 1999).
Akatsu et al., "A Highly Manufacturable 110nm DRAM Technology with 8F2 Vertical Transistor Cellfor IGb and Beyond"; Symposium on VLSI Technology; pp 52-53 (2002).

* cited by examiner

*Primary Examiner*—Phuc T. Dang
(74) *Attorney, Agent, or Firm*—Graham S. Jones; H. Daniel Schnurmann

(57) ABSTRACT

An integrated circuit device including at least one semiconductor memory array region and logic circuits including a support region is formed by the following steps. Form a sacrificial polysilicon layer over the array region. Form a blanket gate oxide layer over the device. Form a thick deposit of polysilicon in both the array region where word lines are located and in the support region where the logic circuits are located. Remove the thick polysilicon layer, the gate oxide layer and the sacrificial polysilicon layer only in the array region. Then deposit a thin polysilicon layer in both the array region and support regions. Next deposit a metallic conductor coating including at least an elemental metal layer portion over the thin polysilicon layer. Then form word lines and sate electrodes in the array region and support region respectively.

20 Claims, 21 Drawing Sheets

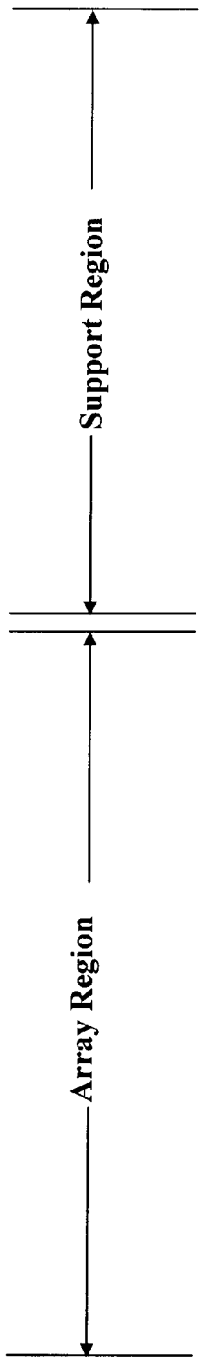
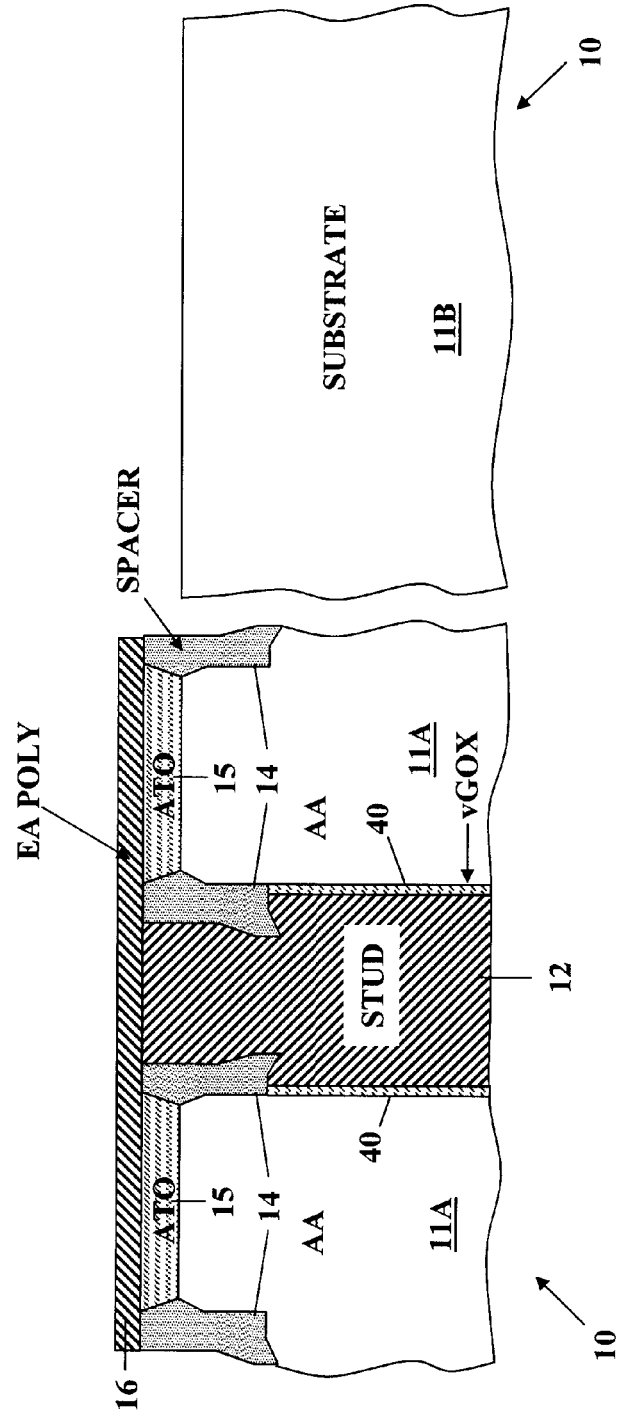
FIG. 4

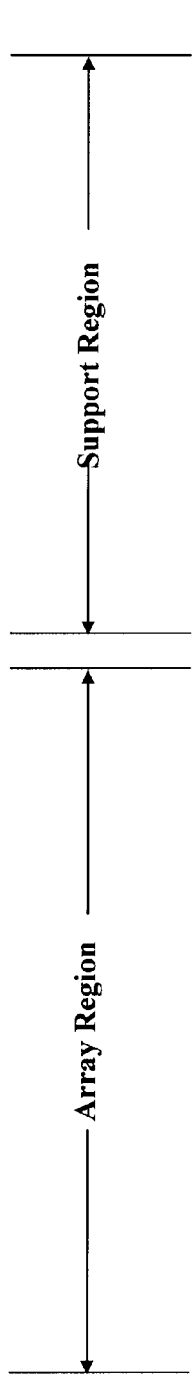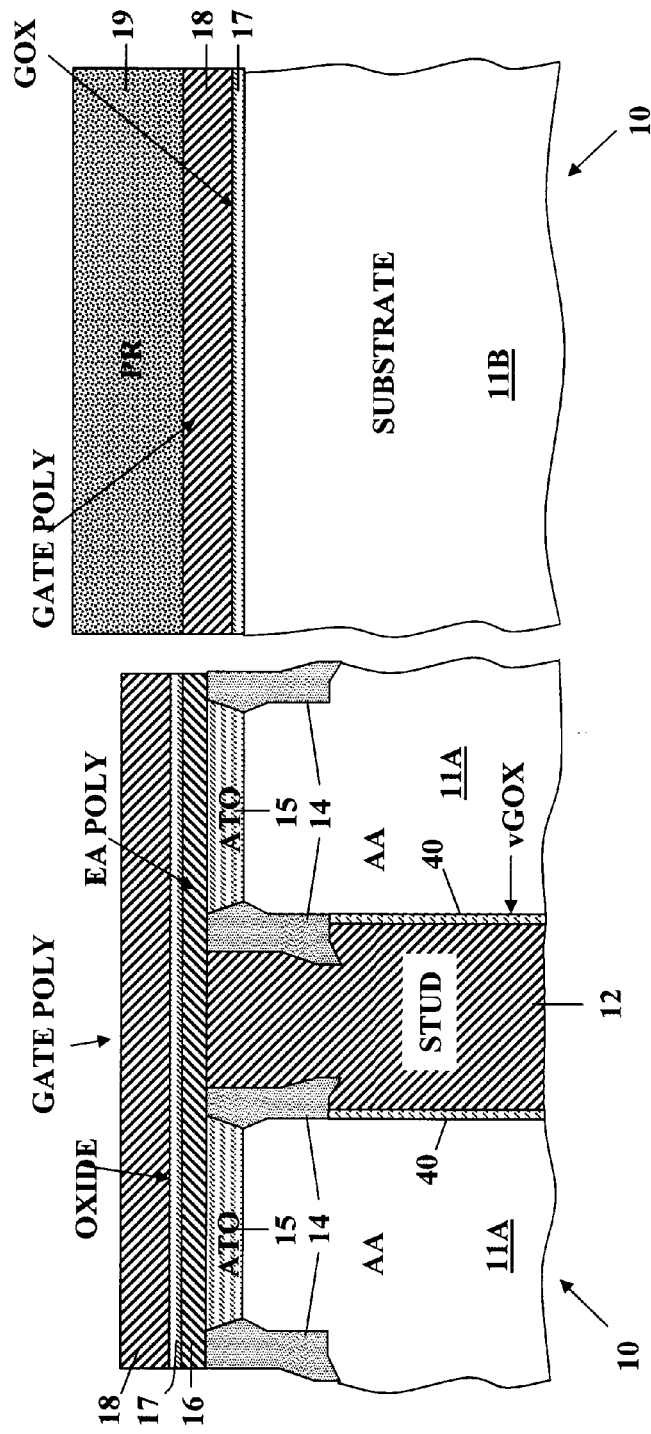
FIG. 7

METHOD FOR MANUFACTURING TUNGSTEN/POLYSILICON WORD LINE STRUCTURE IN VERTICAL DRAM

BACKGROUND OF INVENTION

This invention relates to methods of manufacture of word line structures in a memory array in which information is stored and the structures formed thereby, and more particularly to DRAM (Dynamic Random Access Memory) arrays.

A memory array can be a part of a stand alone memory chip or can be a part of on-chip memory such as a memory cache of a microprocessor or digital circuit processor. "Random logic circuitry", which comprises circuits that process information, may include "memory support circuitry" which provides read/write capability to and from a memory array. Random logic circuitry is not limited to "memory support circuitry" and could include arithmetic units, buses, latches, phase locked loops, etc. In a memory array there are word lines and bit lines which comprise the interconnect structures therein. A memory array consists of a plurality of individual memory cells with each cell having at least one "pass" or "access" transistor. Each "pass" transistor is gated by one of the word lines.

For the purpose of this invention, "word lines" are local interconnect structures created at the transistor gate level. Consequently, they are included, at least partially, as integral parts of a gate conductor structure or stack.

A gate conductor stack in a random logic circuitry serves as both the transistor gate and as a local interconnect. For instance, the gate conductor in a random logic circuit delivers an electrical signal from a gate contact to a remote portion of the adjacent logic transistor.

Because memory arrays are designed to be as dense as possible (thereby maximizing the amount of information stored per given chip area), the word lines are very narrow, long conductors which provide electrical connections between many memory cells. In a typical state-of-the-art memory array, a word line has a width of about 100 nm and connects hundreds of individual memory cells stretching longer than 10 μm in length. The word line width will continue to shrink in accordance with the general trends of miniaturization. At the same time, the length of word lines has been maintained as long as possible to allow simultaneous access to as many of the individual cells of the memory array, as possible. Subsequently, scaling down of word line lengths is not expected to be as fast as that of scaling down of the widths thereof. Therefore, the electrical resistance of word lines is becoming increasingly higher. One simple method of reducing the electrical resistance of word lines is to make them thicker. However, in the case of making them thicker, the capacitance per unit length becomes prohibitively high. Alternatively, a high aspect ratio (i.e. the ratio of line thickness to the line width) makes line etching processes less controllable, leading to an undesirable variation of line widths and/or sidewall profiles. A preferred method of reducing electrical resistance of word lines is to introduce new materials with higher electrical conductivities. Such new materials should be compatible with high-temperature processing (junction activation at 1000° C., for example) typically encountered at the gate level. Furthermore, such new materials should be compatible with transistor gate dielectric so that they do not introduce undesirable shifts in transistor performance.

Random logic transistors are typically designed to be superior switches meaning that a given "off current" their "on current" should be maximized. A high "on current" allows for a quick switching (charging or discharging) a load capacitance with a minimal dissipated power at a fixed "off current". Further, a random logic circuit including local interconnects is designed for a minimum value of loading capacitance and for fast switching. Accordingly, the length of local interconnects is typically kept as short as possible in order to avoid introducing any extra delay time for transmission of signals of the kind associated with long local interconnects. Control of transistor gate length (related to the width of gate stack line) is directly related to the switching performance of a logic transistor. Factors affecting control of transistor gate length include planarity of the gate conductor layer, the aspect ratio of various dissimilar material layers present in the gate electrode stack, and the availability of selective Reactive Ion Etching (RIE) processes for dissimilar materials present in the gate electrode stack. Enhanced planarity is preferred. A low aspect ratio is also preferred. In addition, a higher etch selectivity is preferred.

Typically, a gate electrode structure that comprises a local interconnect runs over underlying isolation structures. For instance, a word line which connects multiple memory cells runs over isolation structures used to isolate various electrical elements (transistors, for instance) in memory cells and to isolate different memory cells.

Accordingly, the gate electrode stack material should be compatible with both the geometry and the material of which such isolation structures are composed to avoid inadvertent electrical short circuits (shorts) or open circuits (opens). Such electrical opens typically form when a portion of the gate local interconnect is missing due to either loss of adhesion, severe overetching, or inability to maintain continuity during the deposition process (poor step coverage during deposition, for instance). Electrical shorts typically form when a gate material has not been completely cleared during local interconnect etching, or, alternatively, when an underlying isolation structure has been severely overetched allowing for an inadvertent electrical connection to surrounding conductive structures.

Because of different design objectives, the gate conductor structure can be beneficially different in memory array(s) and random logic circuits. In that case, the gate conductor structures should meet compatibility requirements not to degrade performance of either memory array or random logic circuitry. Desirably, prior to gate level patterning, the gate conductor layer should be as planar as possible. It is also desirable that a RIE process should be able to etch dissimilar array/logic gate structures simultaneously, without introducing undesirable effects such as gate dielectric punch through, isolation punch through, electrical shorts due to incomplete etch, and electrical opens due to an overetch. Desirably, both conductor structures should be compatible with respective gate dielectrics such that both "pass" transistor and logic transistor do not have undesirable shifts in performance. It is also desirable that both conductor structures should be compatible with underlying isolation structures such that there is no loss of adhesion between the gate conductors and respective isolation structures.

Polysilicon-metal silicide gate electrode structures are widely used to reduce electrical conductivity of gate conductors. Polysilicon is a high temperature stable material compatible with a typical gate dielectric and isolation dielectric materials. Metal silicide possesses a metallic type of conductivity providing low resistance for the gate electrode stack. In one example, the metal silicide is a tungsten silicide (WSi) deposited over a polysilicon layer. Such a conductive stack comprised of polysilicon and deposited silicide is typically referred to as "polycide". The polysilicon layer thickness is selected to be as small as possible thereby preventing increasing gate electrode stack aspect ratio and/or capacitance but at the same time it is selected to be thick enough for etching WSi layer without compromising any underlying dielectric structures. In addition, the polysilicon layer should be thick enough to substantially block diffusion of fluorine (F) gas or elemental fluorine if the tungsten silicide deposition process employs tungsten hexafluoride ($WF_6$) gas as a tungsten precursor.

Polysilicon-metal gate electrode structures provide a further reduction in electrical resistance because electrical conductivity of elemental metal films is generally larger than that of metal silicides. Refractory elemental metals such as tungsten (W), molybdenum (Mo), and tantalum (Ta) are typically employed in polysilicon-metal gate electrode structures. A thin conductive diffusion barrier is typically disposed between the polysilicon and the elemental metal to prevent silicidation of the elemental metal during high-temperature processing. The diffusion barrier is typically comprised of conductive metal nitrides such as tungsten nitride (WN), titanium nitride (TiN), tantalum nitride (TaN) and/or respective silicon-containing ternary compounds such as WSiN, TiSiN, and TaSiN. In addition, an ultra thin quantum conductive barrier made of otherwise insulating material such as silicon nitride can also be included into the conductive diffusion barrier. One particularly useful example is a polysilicon-barrier-W gate stack where the barrier is composed of tungsten nitride (WN). In this example, RIE of tungsten has a poor selectivity to an underlying polysilicon layer meaning that the polysilicon layer etches with about the same speed as the tungsten (W) layer. Further, RIE of tungsten (W) requires a large overetch typically up to 100% to completely clear tungsten (W) from around the steps formed by isolation structures. Due to poor etch selectivity between polysilicon and tungsten (W) and a requirement of tungsten layer overetch, the polysilicon thickness is selected to be larger than that of the tungsten (W) layer to avoid any gate dielectric punch through.

FIG. 1. shows a sectional view of a prior art DRAM device 8 of the kind described in a paper by Rama Divakaruni et al. entitled "Gate prespacers for high density DRAMs International Symposium on VLSI Technology Systems and Applications Taipei, Taiwan 8–10 (June 1999). The device 8 includes an array region on the left and a support region on the right, with the two regions being spaced apart as indicated by the break away lines in the center. A silicon substrate 11A/11B includes active areas 11A in the array region and doped silicon 11B in the support region.

In the array region, a doped polysilicon stud 12 is shown formed on the top of a deep trench above a storage capacitor, not shown. The upper portion of the deep trench is lined on the sidewalls thereof by dielectric regions 14 with a vertical gate oxide layer (vGOX) layer 40 which lines the sidewalls of the trench therebelow. In its lower portion, the polysilicon stud 12 is directly adjacent to the vertical gate oxide layer (vGOX) 40 trench as is well understood by those skilled in the art, thereby forming the gate electrode of a vertical transistor. On either side of the active areas 11A near the top surface of the substrate 11A are the dielectric regions 14 with an Array Top Oxide (ATO) region 15 on the top surface of the active areas AA, between the dielectric regions 14.

Three word line stacks 26A, 26B and 26C comprising polycide conductors 21P capped with silicon nitride caps 22, i.e. Cap Nitride (CN), are formed on top of the left hand and right hand ATO regions 15 and in the middle above the stud 12. The polycide conductors 21P are isolated from the active areas AA by the ATO 15 on the right and the left, but the polycide conductor 21P of the central word line stack 26B is in contact with the stud 12. Accordingly the stud 12 and polycide conductor 21P on top of it comprise, the integrated gate stack 26B of a vertical "pass" transistor. The top of the stud has a recess 30 formed between the base of the polycide conductor 21P of the central word line stack 26B and the adjacent dielectric region 14.

In the support region, on the right of FIG. 1, the top surface of the substrate 11B is covered with a Gate OXide (GOX) layer 17. Above the GOX layer 17 a gate electrode stack 27 is shown comprising a gate electrode comprising a doped gate polysilicon layer 18 formed on the surface of the GOX layer 17 and a polycide conductor 21P thereabove which in turn is capped by a cap nitride (CN) layer 22.

FIG. 2 shows a device 9 which is a modification of the device 8 of FIG. 1 in accordance with the paper by Akatsu et al. entitled "A highly manufacturable 110 nm DRAM technology with $8F^2$ vertical transistor cell for 1 Gb and beyond", Symposium on VLSI Technology, P52, (2002).

In FIG. 2 all of the elements of FIG. 1 are shown with the modification that there are silicon nitride spacers 25 formed on the sidewalls of the stacks 26A–26C in the array region and on the sidewalls of the gate electrode stack 27 in the support region. In addition, the conductors 21A comprise a WN/W metallic bilayer, not the polycide conductors 21P of FIG. 1. Accordingly, the resistance of a gate stack (or word line) shown in FIG. 2 is about from 2 to 4 times lower than that of FIG. 1 while maintaining similar stack (or word line) capacitance.

Akatsu et al. teach a dense memory array with vertical pass transistors, thick top oxide isolation structures, barrier-W word lines, and polysilicon-barrier-W gates. Akatsu et al. also teach an integration of such dense memory array with random logic circuitry comprised of transistors with polysilicon-barrier-W gates. In the memory array, vertical pass transistors are formed on the walls of respective trenches made in the silicon substrate.

In FIG. 2, a conductive polysilicon plug 12 filled into the top portion of a trench forms a gate of a vertical pass transistor. The polysilicon plugs 12 of individual trenches are connected by a word line 26B which runs over the trenches, top oxide isolation structures, and isolation trenches. The word line 26B is composed of a WN/W metallic bilayer 21A. In the logic circuitry, the gates of transistors are composed of polysilicon-barrier-metal structure. In order to improve planarity of the gate conductor layer, the thickness of the top oxide in the array is chosen to be close to that of the polysilicon layer in the logic circuitry area. Akatsu et al. teach that a non-planar structure may exist in the transition region between memory array and logic circuitry; and that, in the logic circuitry; the polysilicon layer was made substantially thicker than that the metal layer to avoid gate dielectric punch through.

SUMMARY OF INVENTION

A) There is a problem of how to improve word line continuity in the memory cell arrays of vertical DRAM devices since the process of Physical Vapor Deposition (PVD) of tungsten (W) (referred to hereinafter a PVDW) has excessively poor step coverage to form electrodes on various shapes of topography. PVDW yields poor step coverage inherently, i.e. if there is any microscopic groove, hump, hillock, PVDW cannot yield a uniform deposit. After patterning with this non-uniform W film, the W line can be disconnected at the weak point. The memory cell array of vertical DRAM after a TOE (Top Oxide Early) process for ATO (Array Top Oxide) process could not have a sufficiently smooth surface.

Some regions can have microscope asperities, holes or grooves and foreign materials. Therefore a WN/W word line in a vertical DRAM cell array has suffered from serious yield problems due to the discontinuity of the WN/W word line. Amorphous Si (which becomes polysilicon Si after thermal anneal) deposited under the WN/W film fills the microscopic holes and smoothens the topography of devices. With an intermediate continuous polysilicon layer under the WN/W word line, the word line discontinuity problem is solved completely.

B) A second problem is how to reduce the word line capacitance since the stack height of a word line is directly related to the capacitance of the word line. Word line capacitance, which includes word line/word line coupling capacitance (from word line to word line) and word line to bit line capacitance can be reduced by decreasing the height of a word line, using low-k dielectric gap filling material, increasing the space between adjacent word lines, increasing the distance between a word line and a bit line, and by decreasing the length of the word line.

In summary, the problem of capacitance is greater in the array area where the devices in the array are in very close proximity to each other. Moreover, the stack height of a word line is directly related to word line capacitance, so a shorter stack height improves capacitance. In addition, reduced capacitance is desirable since device speed decreases with increasing word line capacitance due to RC (Resistance-Capacitance) delay. Accordingly, there is an absolute need for reduced word line capacitance for high speed devices.

C) A third problem is how to improve adhesion of a metallic word line to silicon oxide isolation structures in the array region of the device. If tungsten (W) metal is deposited directly onto silicon oxide, a severe loss of adhesion and subsequent delamination usually occur during a high temperature step such as junction activation anneal. Presence of a WN layer between a W layer and a silicon oxide layer slightly improves the adhesion property of a word line. Nevertheless, a partial loss of adhesion can occur leading to missing parts of the word line and respective electrical opens. Amorphous Si has good adhesion to both silicon oxide layers and metallic structures such as barrier-W. Thus, by deposition of a layer of amorphous Si in between a silicon oxide layer and a metallic word line, word line delamination and related inadvertent electrical opens can be completely prevented.

D) A fourth problem is how to avoid gate dielectric punch through in logic circuits during a gate electrode stack RIE processes.

During the W RIE (Reactive Ion Etching) process, W to polysilicon selectivity is almost 1 to 1. In order to prevent word line to word line shorts, appropriate overetching (50% to 100%) should be employed. If the polysilicon thickness in the support region is not sufficient, the polysilicon in the support region will be consumed completely after the W RIE process. Then, the thin logic gate dielectric will be exposed to a prolonged etching causing its punch through. Then, the Si substrate will be etched quickly by a polysilicon RIE process. This is so called "support region punch through". Support region punch through increases series resistance in the source/drain regions and overlap capacitance between the gate electrode and the source/drain regions of an FET device. However, in the array region, punch through does not happen, due to provision of a thicker ATO (Array Top Oxide) thickness.

We have discovered that a key factor in the solution to the above described problems A–C in the manufacture of MOSFET DRAM devices is to deposit a thin continuous polysilicon layer in the array region. We have also discovered that a key factor in the solution to the above described problem D is to keep a thick polysilicon layer in the support region.

In accordance with this invention a process is provided wherein a thick layer of polysilicon is deposited in both the array region where the array word lines are located and the support region where the logic transistors are located. Then the thick polysilicon layer is removed only in the array region. Next, any dielectric such as silicon oxide is removed from the top surface of the thick polysilicon layer in the support region and from the polysilicon studs in the array region. Finally a thin amorphous polysilicon layer is deposited in both the array region and the support region followed by the deposition of barrier-metal metallic layer.

Alternatively, a deposit may be made of a sacrificial thin polysilicon layer in both the array region and the support region. Then follows removal of the sacrificial thin polysilicon layer in the support region to grow gate oxide in the support region only, followed by the above process steps.

In accordance with this invention, a method is provided for forming integrated circuit device including at least one semiconductor memory array region and logic circuits including a support region including the following steps. Form a thick deposit of polysilicon in both the array region where word lines are located and the support region where the logic circuits are located. Then remove the thick layer of polysilicon only in the array region. Then deposit a thin layer of polysilicon in both the array region and the support region. Then deposit a metallic conductor coating including at least an elemental metal layer portion over the thin layer of polysilicon; and then form word lines and gate electrodes in the array region and support region respectively.

Preferably, the method begins with formation of a sacrificial polysilicon layer over the array region followed by formation of a gate oxide layer over the device, and performing the step of precleaning the device prior to the deposit of the thin layer of polysilicon.

Preferably, a gate oxide layer is formed over the device after formation of the sacrificial polysilicon layer.

Preferably, the method includes forming a barrier layer between the thin layer of polysilicon and the metal layer.

Preferably, the method the thin layer of polysilicon comprises amorphous silicon.

Preferably, the method begins with formation of a blanket sacrificial polysilicon layer over the array region followed by formation of a gate oxide layer over the device; and preferably the method includes forming a barrier layer between the thin layer of polysilicon and the metallic conductor coating.

Preferably, a capping silicon nitride layer is formed over the metal layer before forming word lines and gate electrodes in the array region and support region.

Preferably, the method includes forming the integrated circuit device on a semiconductor substrate with a polysilicon stud is in a trench in the semiconductor substrate under an electrically conductive word line with the stud being electrically insulated from the substrate by dielectric material on sidewalls of said trench and an Array Top Oxide (ATO) layer formed above the substrate aside from the polysilicon stud; and after forming word lines and gate electrodes in the array region and support region forming sidewall spacers on sidewalls thereof.

Preferably, the method includes the step of precleaning prior to the step of depositing the thin layer of polysilicon in both the array region and the support region.

BRIEF DESCRIPTION OF DRAWINGS

The foregoing and other aspects and advantages of this invention are explained and described below with reference to the accompanying drawings, in which:

FIGS. 4–18 illustrate the process of manufacture of the device of FIGS. 3 and 18.

DETAILED DESCRIPTION

Figure 2:
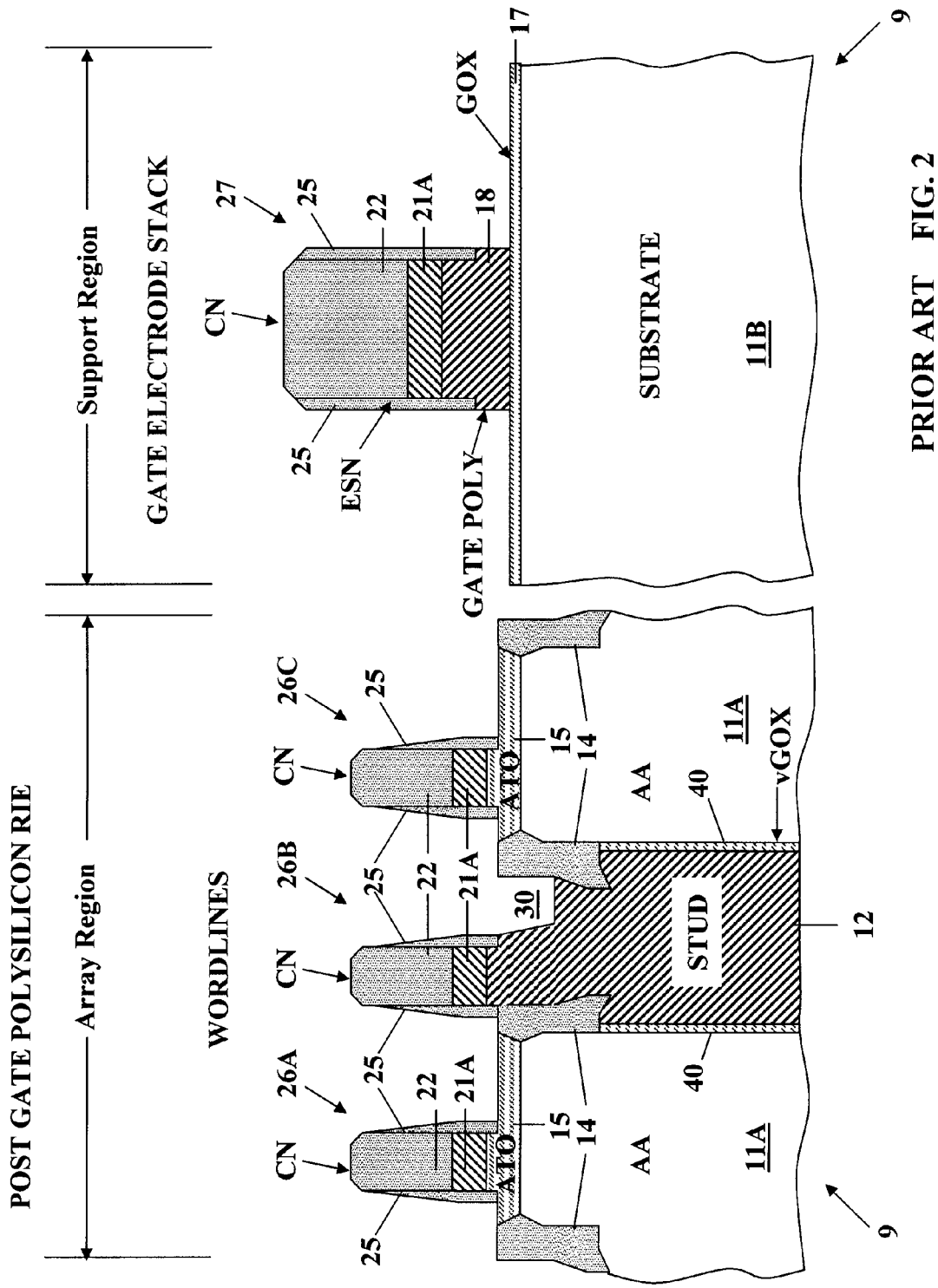
FIG. 2 shows a sectional view of a prior art DRAM device which is a modification of the device of FIG. 1.
Figure 3:
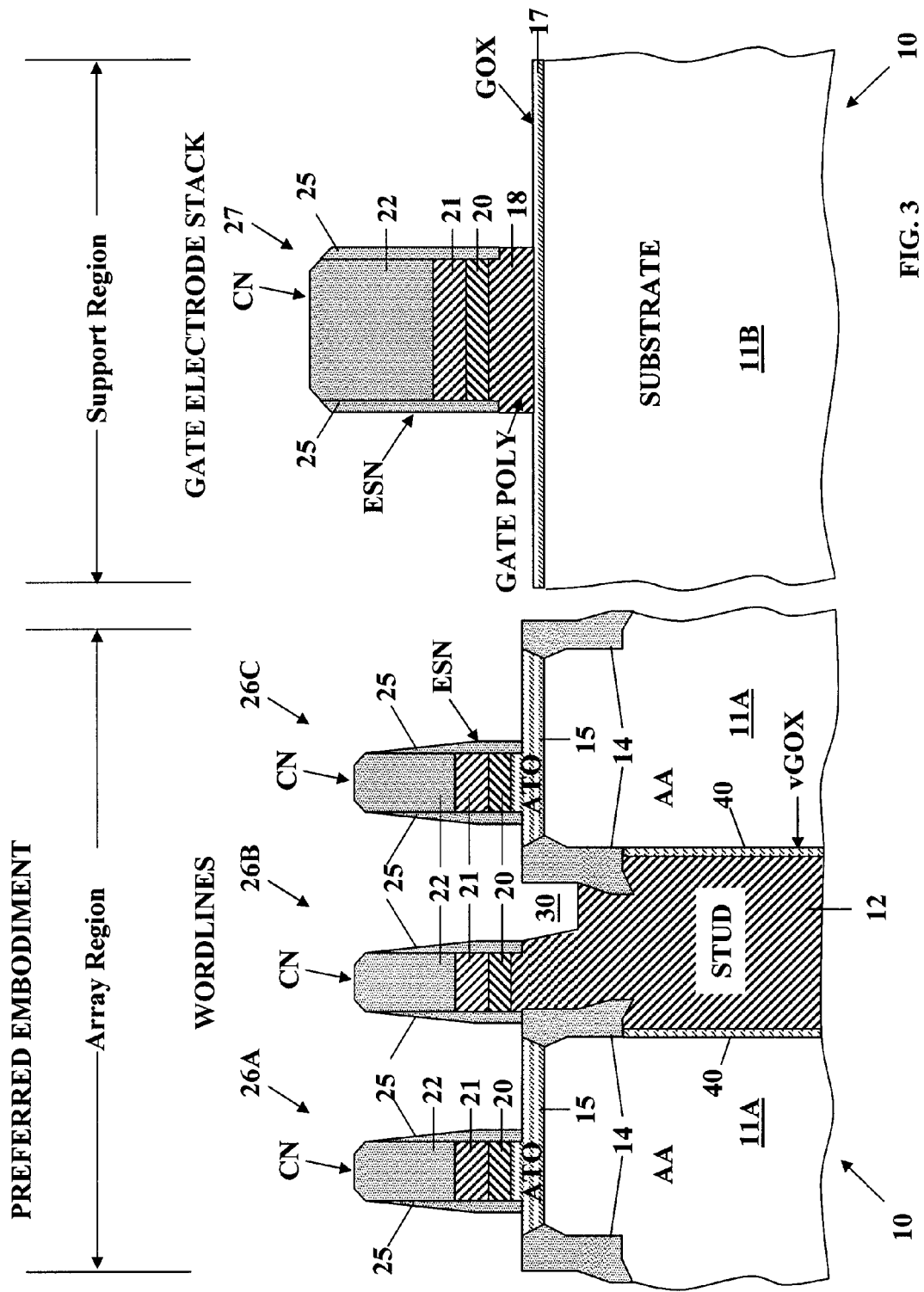
FIG. 3 shows a sectional view of a DRAM device in accordance with this invention which is a modification of the device of FIG. 2.

FIG. 3 shows a device 10 in accordance with this invention, which is a modification of the prior art device 9 of FIG. 2. While keeping thick polysilicon layer 18 at the base of the polysilicon-barrier-metal gate electrode stack 27 in the logic circuitry in the support region, an additional thin layer of polysilicon 20 has been introduced into the word lines 26A–26C as well as stack 27. In the word line stacks 26A–26C, the additional polysilicon layer 20 serves to promote adhesion between a metallic conductor multilayer coating 21, preferably comprising a lower WN film below a W layer or the like as described below, and isolation structures, i.e. ATO layers 15 and sidewall spacers 25, and to improve electrical continuity of word line stacks 26A–26C by conformally covering imperfections in those isolation structures which otherwise could not be covered and/or filled by a metallic layer resulting in a disruption of the word line electrical continuity.

The word line polysilicon layer 20 undesirably increases the aspect ratio and the capacitance of the word line conductors 26A–26C per unit length. In order to minimize these undesirable effects, the word line polysilicon layer 20 is made substantially thinner than the metallic conductor multilayer coating 21. In order to be continuous, the word line polysilicon layer 20 is deposited in the amorphous form with target thickness of larger than 5 nm and preferably from about 10 nm to about 30 nm, more preferably at 20 nm. Alternatively the thickness can be small and could be from about 5 nm to about 10 nm. The thickness of word line metallic conductor multilayer coating 21 is typically in the range of from 20 nm to 80 nm, preferably from 30 nm to 60 nm, more preferably at 45 nm.

A preferred structure of metallic conductor multilayer coating 21 comprises a thin conductive diffusion barrier, e.g. WN followed by a thicker elemental refractory metal layer, e.g. W. While the preferred elemental refractory metal is tungsten, other refractory elemental metals such as molybdenum (Mo) and tantalum (Ta) can also be used. A preferred conductive diffusion barrier is comprised of metal nitrides such as tungsten nitride (WN), molybdenum nitride (MoN) and tantalum nitride (TaN). A highly preferred conductive diffusion barrier also includes an ultra thin (<1.5 nm) quantum conductive diffusion barrier comprised of silicon nitride in addition to any metal nitrides. Other conductive materials which can be used in the diffusion barrier include titanium nitride (TiN), tantalum nitride (TaN), silicon-containing ternary compounds such as WSiN, TiSiN, and TaSiN, metal suicides such as titanium silicide TiSi, tantalum silicide TaSi, tungsten silicide WSi, etc. While a small amount of oxygen atoms can be also present in the diffusion barrier structure, the presence of oxygen is undesirable. One example of a preferred multilayered conductive diffusion barrier has been provided in the Larry Clevenger et al U.S. patent application Ser. No. 10/411,710 of entitled "Nitride and Polysilicon Interface with Titanium Layer" filed: 18 Sep. 2002.

Step 1.

Referring to FIG. 4 the device of FIG. 3 is shown in an early stage of manufacture. The ATO (Array Top Oxide) layers 15 are formed above the active areas 11A in accordance with a process such as the TOE (Top Oxide Early) process, described in commonly assigned U.S. Pat. No. 6,620,676 of Malik et al. entitled "Structure and Methods for Process Integration in Vertical DRAM Cell Fabrication". Hummler U.S. Pat. No. 6,620,677 entitled "Support Liner for Isolation Trench Height Control in Vertical DRAM Processing" describes various ways of forming Top Oxide including TOE.

Above the array region, including the ATO layer 15 and the dielectric regions 14, a sacrificial EA polysilicon layer 16 is formed over the array region for blocking chemical etching.

Step 2.

Figure 5:
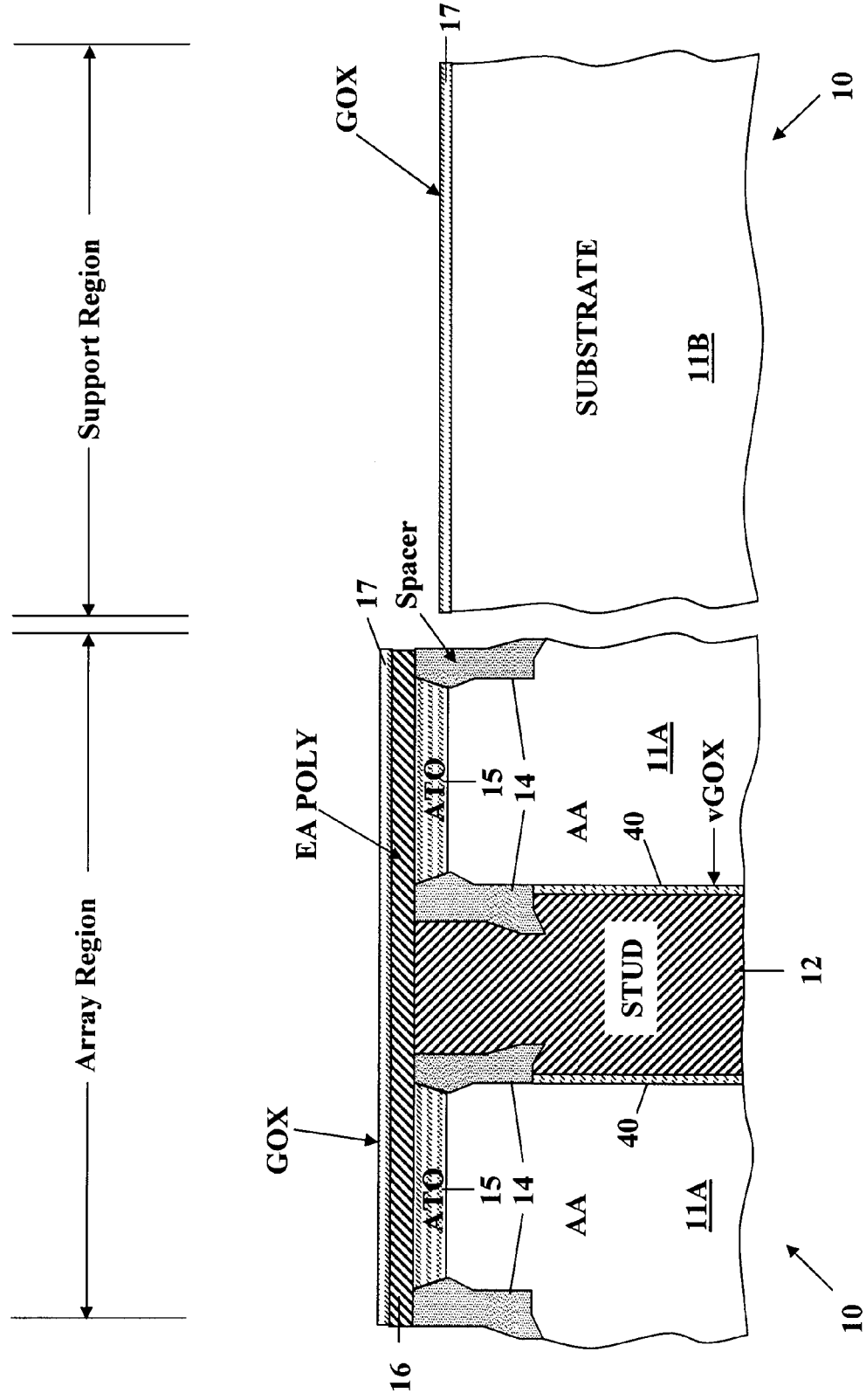

Referring to FIG. 5 the device of FIG. 4 is shown after a blanket thin gate dielectric layer which in the preferred embodiment is a gate oxide GOX layer 17 has been formed over the device 10 in the array region covering the sacrificial polysilicon layer 16 and in the support region covering the substrate 11B. The gate oxidation process employed is the normal furnace oxidation process for gate oxide formation in a support region.

Other known gate oxidation processes can be used at this step. These processes may include Rapid Thermal Oxidation (RTO) processes conducted in various oxidation ambients such as pure molecular oxygen, water vapor, mixture of oxygen and hydrogen, ozone, $N_2O$, NO, and oxygen radicals created with some excitation (e.g. plasma, remote plasma, UV radiation, remote intense heat). The oxidation can be also followed or preceded by a nitridation step to incorporate a desired amount of nitrogen atoms in the gate oxide.

Alternative methods can be used to deposit the gate dielectric material including a GOX layer 17. While silicon oxide or oxynitride is a highly preferred material for a gate dielectric, other gate dielectric materials such as high dielectric constant (high-k) materials (e.g. HfO, HfSiO, HfSiON) can also be used. Further, the gate oxidation processes can be repeated several times to form a gate oxide layer 17 having different thickness and/or chemical composition in different logic areas. The gate oxide layer 17 in the array region will be removed during polysilicon removal process in step 5, which is described below.

Step 3.

Figure 6:
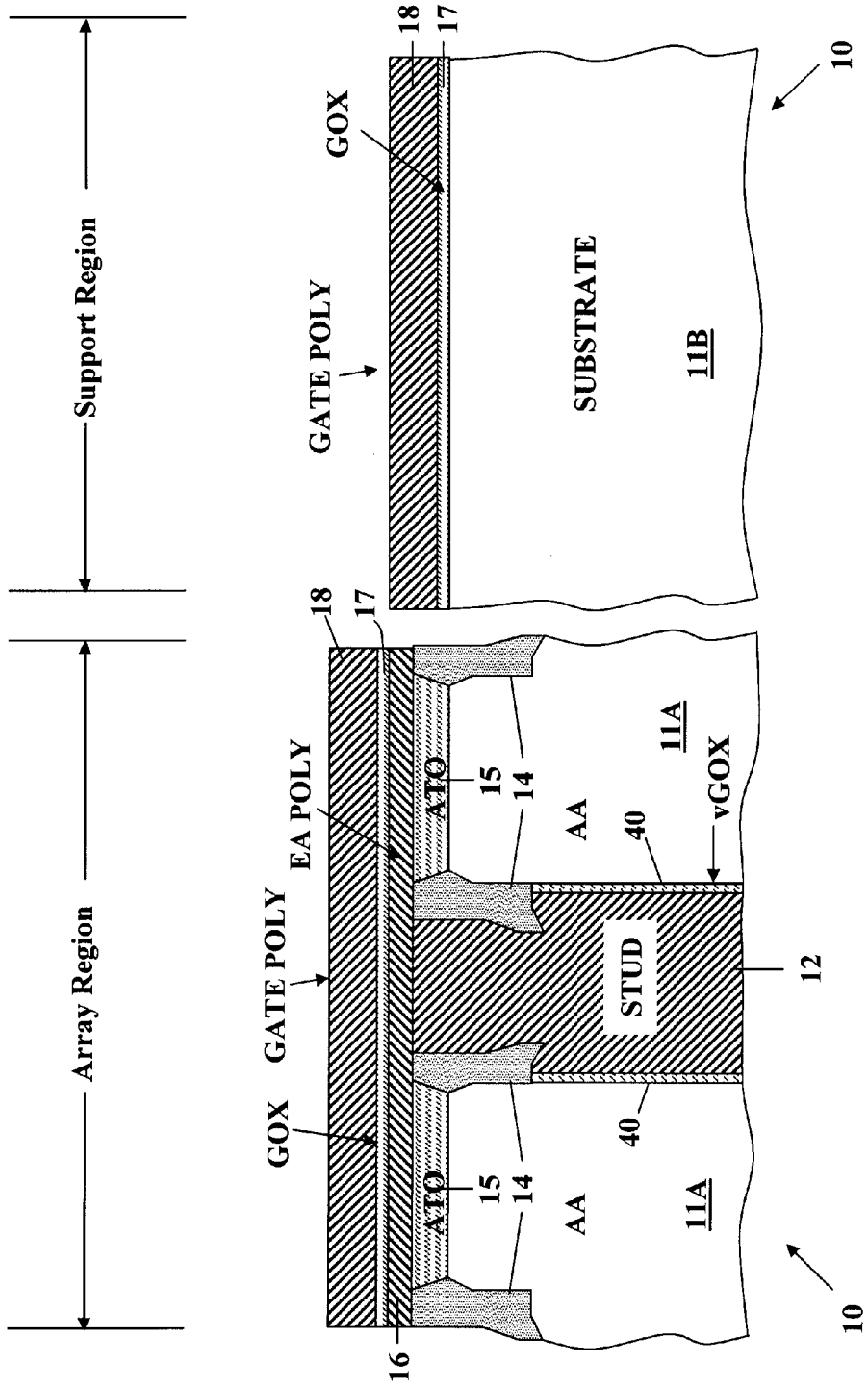

Referring to FIG. 6 the device of FIG. 5 is shown after a thick gate polysilicon layer 18 has been deposited in both the array and support regions in a conventional blanket deposition of doped gate polysilicon, usually from about 500 Å to about 1000 Å thick forming a conductive, polycrystalline structure. The polysilicon layer 18 can be deposited in either amorphous silicon or polycrystalline silicon form. The deposition process is generally conducted at a reduced pressure in the presence of silicon-containing precursor gas such as silane $SiH_4$, disilane $Si_2H_6$, or chlorine-containing silicon precursors $SiCl_4$, $SiH_2Cl_2$, $SiHCl_3$, and $SiH_6Cl_6$.

A carrier gas such as hydrogen ($H_2$) and/or a neutral gas such as nitrogen ($N_2$) or argon (Ar) can be also included into the deposition mixture. Generally, single wafer reactors such as Rapid Thermal Chemical Vapor Deposition (RTCVD) reactors or batch type reactors such as Low Pressure CVD (LPCVD) furnaces can be employed at this step. The doping of the polysilicon layer can be accomplished during its deposition (in-situ) by adding a dopant precursor to the gas mixture.

The following dopant precursors are commonly used: $AsH_3$ for arsenic doping, $PH_3$ for phosphorus doping, and $B_2H_6$ for boron doping. A preferred deposition method is an RTCVD process with $SiH_4$ as a silicon precursor, $H_2$ gas as a carrier gas, and $PH_3$ gas as a gas source for in-situ phosphorus doping. This process results in a conformal conductive (n-type) polysilicon layer with concentration of phosphorus atoms above about 1e20 $cm^{-3}$.

Alternatively, the polysilicon layer can be deposited undoped and the dopants can be introduced after deposition using ion implantation, for example. In the latter case, the polysilicon layer can be doped differently in different parts of logic circuitry with the use of conventional photoresist block mask(s).

Step 4.

Referring to FIG. 7 the device of FIG. 6 is shown after formation of a blocking mask 19 covering the support region. The blocking mask 19 is a conventional photoresist mask formed, using conventional photolithography.

Step 5.

Figure 8:
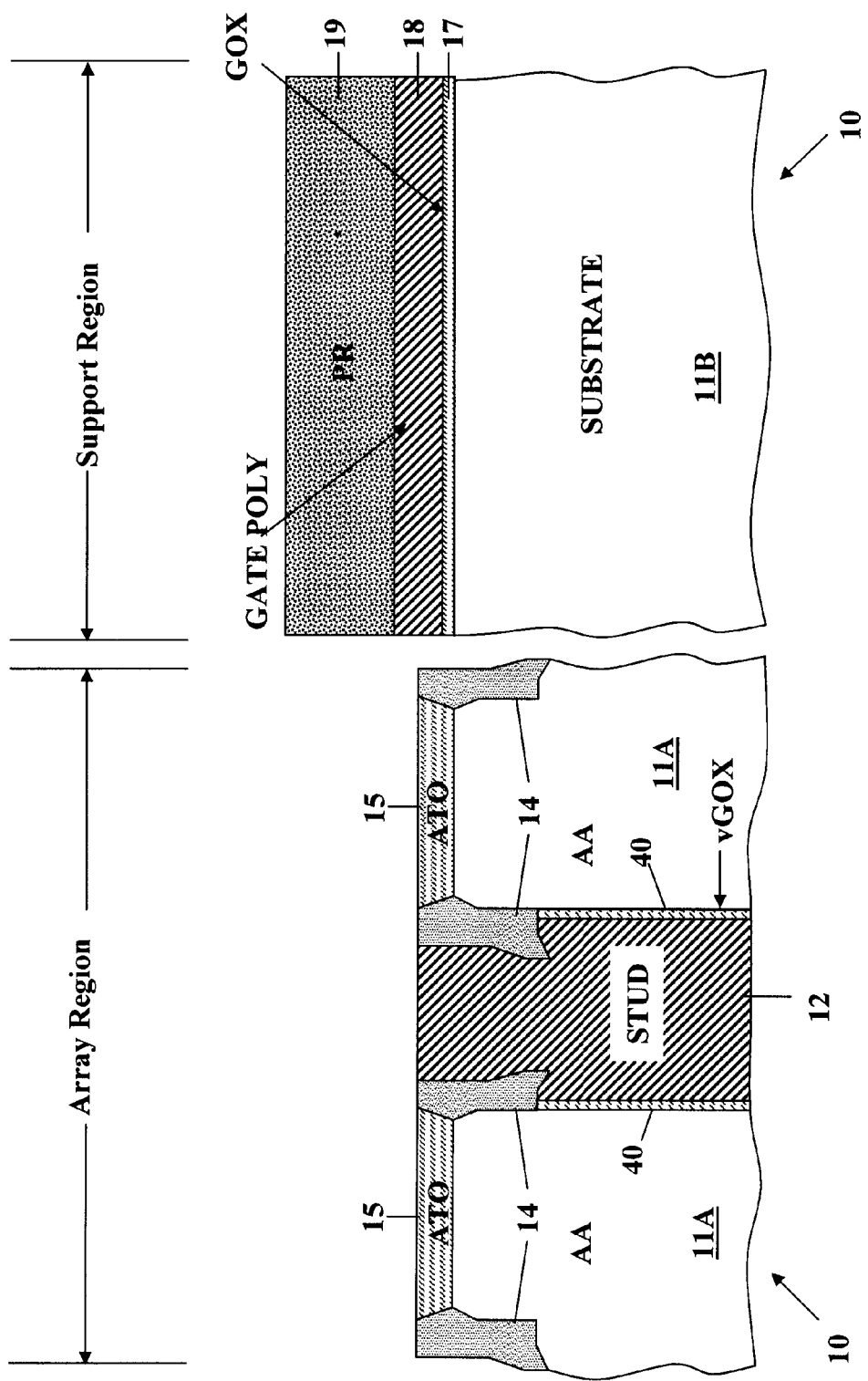

Referring to FIG. 8 the device of FIG. 7 is shown after removal of three layers on the left side of FIG. 8 including the gate polysilicon layer 18, the GOX layer 17 and the EA polysilicon layer 16 from the array region using Chemical Downstream Etching (CDE), which involves using fluorine-based chemistries, may be used to remove the polysilicon and silicon oxide layers 16/17/18. The blocking mask 19 is patterned such that the polysilicon 18/GOX 17/sacrificial polysilicon 16 are sequentially exposed in the array region as the CDE process proceeds. The mask 19 protects the support regions on the right side of FIG. 8. This allows for the polysilicon 18/GOX 17/sacrificial coating including at least an elemental metal layer portion polysilicon 16 to be removed by a dry isotropic etch, i.e. Chemical Downstream Etching (CDE) technique that isotropically removes the polysilicon 18/16 in the array selective to the underlying nitride layer 14.

Step 6.

Figure 9:
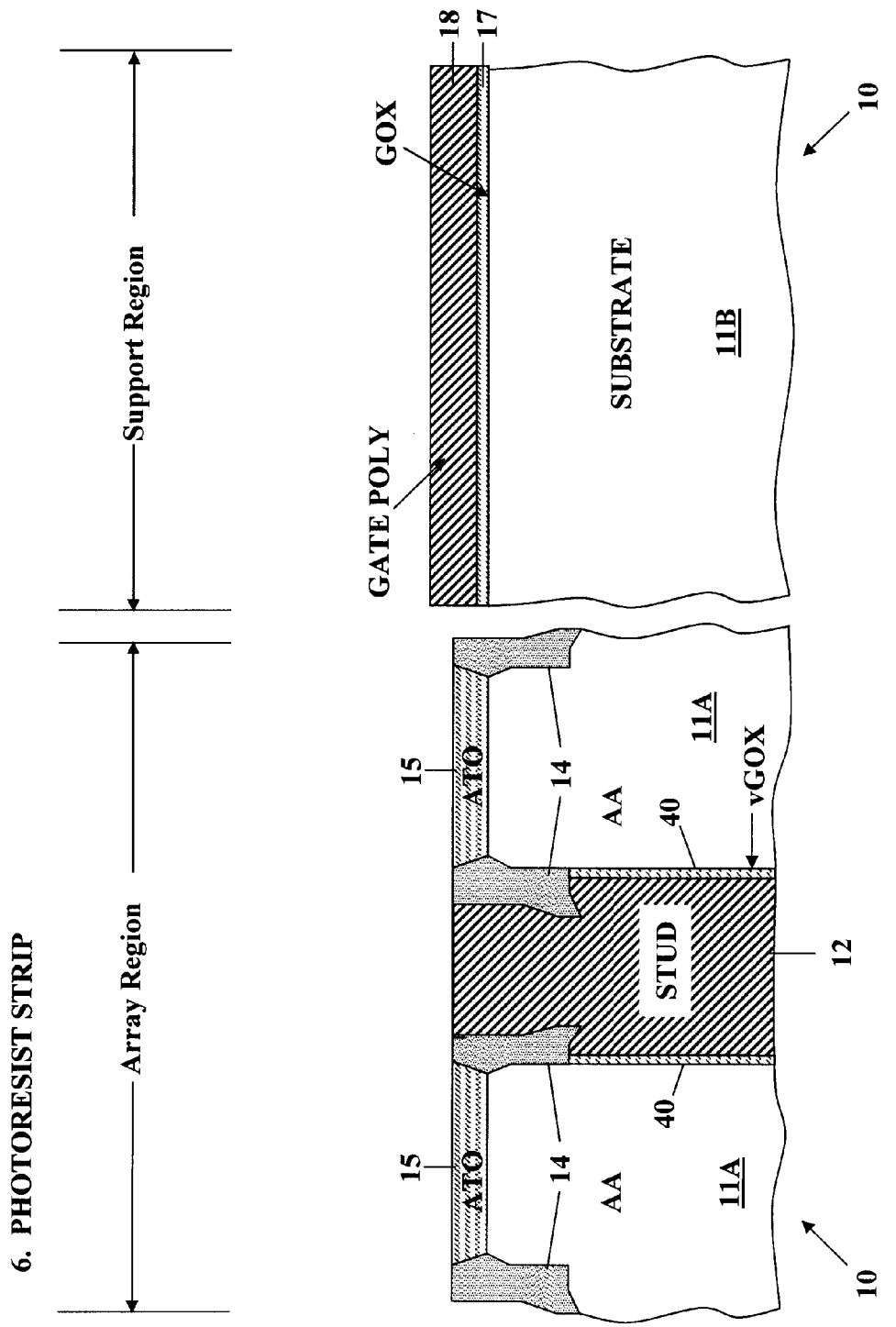

Referring to FIG. 9, the device of FIG. 8 is shown after a standard photoresist stripping process removing the blocking mask 19 to expose the top surface of the gate oxide layer 18 in the support region. We note that the exposed top surfaces of gate polysilicon layer 18 and stud polysilicon 12 can be oxidized during the resist stripping process resulting into an unwanted thin layer (less than 50 Å in thickness) of chemical silicon oxide.

Step 7.

Figure 10:
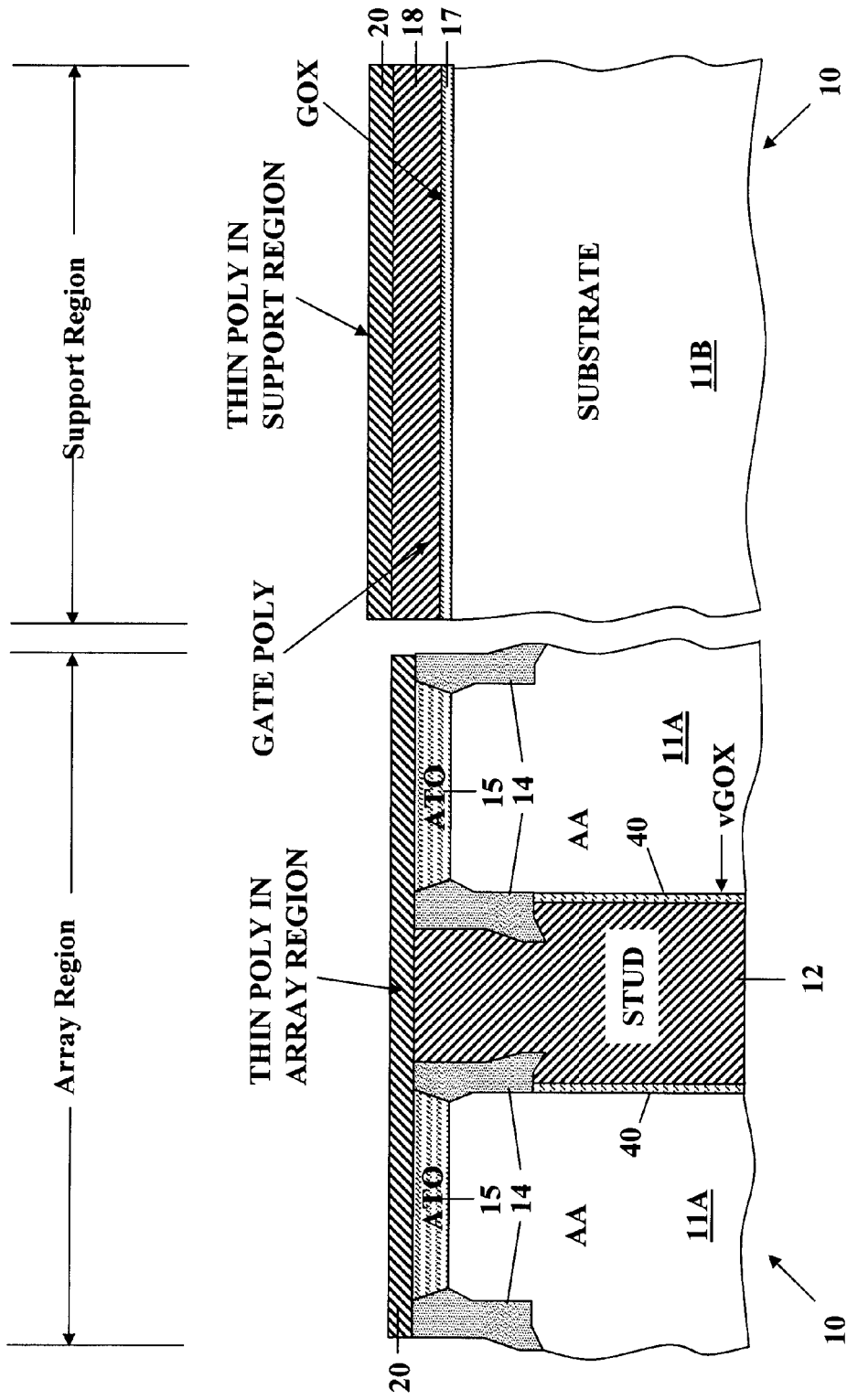

Referring to FIG. 10 the device of FIG. 9 is shown after precleaning (a first preclean) to remove unwanted thin layer of any native or chemical silicon oxide from the exposed surfaces of the device 10.

The next part of Step 7 is to deposit a blanket thin polysilicon layer 20, which is preferably amorphous silicon, over both the array and support regions.

The precleaning is performed using wet chemical i.e. 200:1 DHF. For example, U.S. Pat. No. 6,475,893 of Giewont et al. entitled "Method for improved fabrication of salicide structures" describes method for improved fabrication of salicide structures pre-cleaning process is thereafter completed with a DHF etch. The DHF etch is used to remove the chemical or native oxide layer on the polysilicon gate and the silicon diffusion regions. The DHF etch solution may have a concentration of about 200:1 deionized water: (49% by weight) HF. The etching is carried out at about 22° C. until about a 150 Å equivalent thermal oxide has been removed.

The wafer is then rinsed in deionized water for about 600 seconds and dried by surface tension gradient drying, such as in a Marangoni dryer. After photoresist removal, followed by careful organic cleans, the structure is subjected to a 200:1 by weight, Dilute HydroFluoric, (DHF), acid solution, at a temperature between about 20° C. to 25° C., for a time between about 60 sec to 120 sec, for purposes of removing any native or chemical oxide from the surface. It should be noted that other HF solutions may be substituted for the above, such as a buffered hydrogen fluoride (BHF) or other DHF concentrations, so long as the targeted removal of about 30 Å–200 Å of the thermal oxide is controlled and high-quality drying processes are used. The upper oxide removal target for such preclean should be substantially less than the thickness of ATO layer 15.

The thin, polysilicon layer 20, which is preferably an amorphous silicon (a-Si) layer is deposited in a blanket, conformal deposition by normal CVD deposition, similar to the deposition process in step 3 above. It is important that a deposition technique used for forming the thin, polysilicon layer 20 produces a conformal and continuous film. Typically, a CVD process produces silicon film with desired qualities. For instance, an RTCVD process with $SiH_4$ as a silicon precursor and $H_2$ gas as a carrier gas can be used for this purpose. The wafer temperature is selected such that the silicon is deposited in an amorphous form. For RTCVD processes, the wafer temperature should be less than about 580° C. for depositing amorphous silicon.

Generally, an amorphous Si film has a better continuity in thin film regime (<200 Å) than a polysilicon film. Accordingly, one can deposit a conformal continuous amorphous silicon film as thin as 50 Å. Below 50 Å, the film is typically discontinuous in the form of islands.

Hence, the low limit on film thickness is about 50 Å, while the upper limit is selected to avoid a substantial increase in word line capacitance and/or aspect ratio. The polysilicon layer thicker than the metallic layer on top of it would almost double the word line capacitance per unit length and therefore is highly undesirable. A highly preferred thickness range of the polysilicon layer is from about 100 Å to about 300 Å, with 200 Å being more highly preferred.

Step 8.

Figure 11:
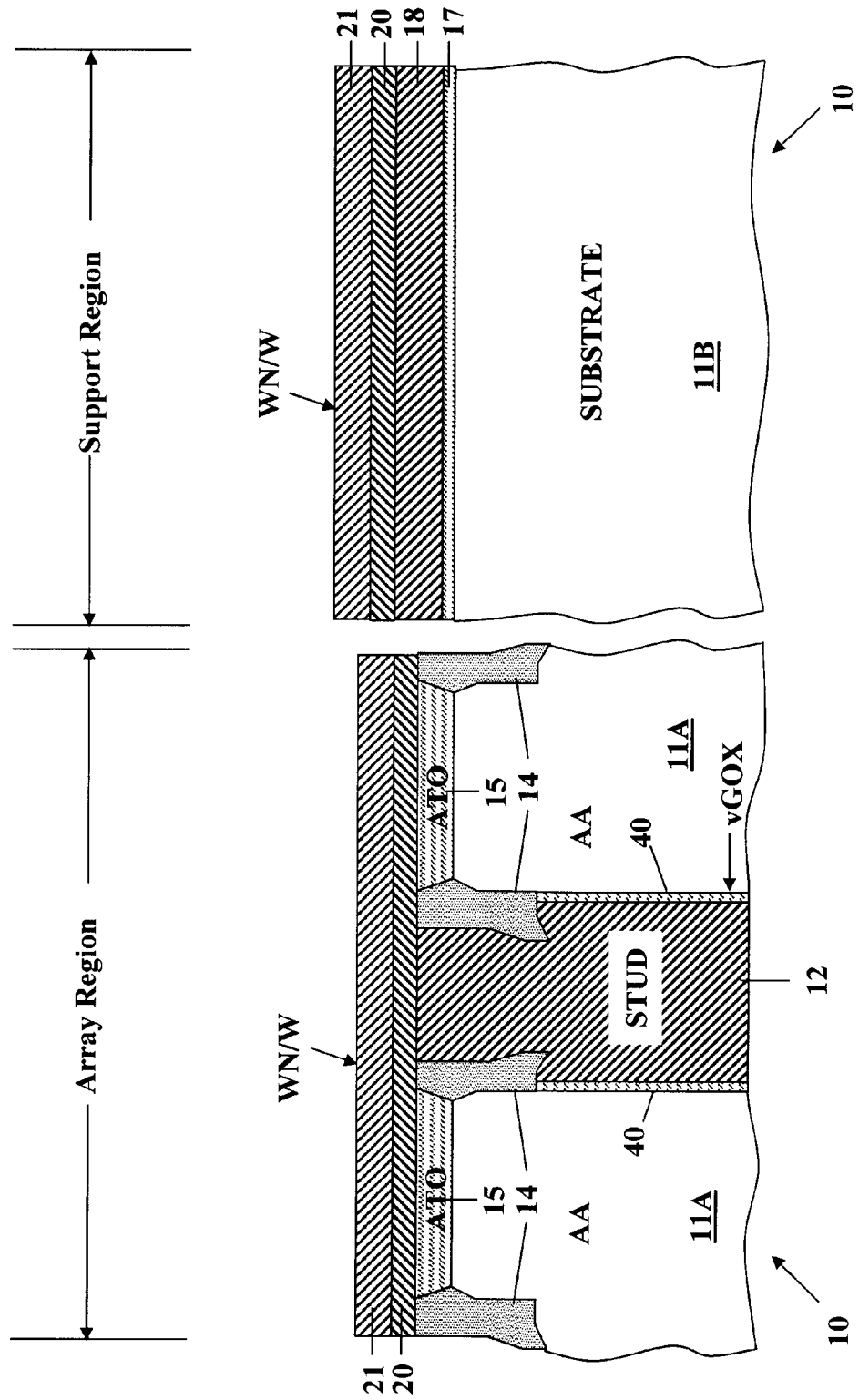

Referring to FIG. 11 the device of FIG. 10 is shown after WN/W deposition process in which the blanket WN/W, metallic conductor multilayer coating 21 are formed over the blanket thin polysilicon layer 20. In the preferred embodiment as shown in FIG. 11, the blanket deposit of metallic conductor multilayer coating 21 of FIG. 3 are formed of a deposit of a very thin diffusion barrier layer of WN followed by a deposit of an elemental metal tungsten (W) layer which is substantially thicker. A Physical Vapor Deposition (PVD) process is preferably employed to form both the diffusion barrier layer starting with a thin film of WN deposited on the blanket thin polysilicon layer 20 and the elemental metal layer of W is then deposited on top of the thin film of WN.

Prior to PVD deposition of the WN and W layers, the top surface of thin, polysilicon layer 20 is cleaned in a second preclean using a DHF solution to remove any native silicon oxide. The second preclean is similar to the first preclean described in Step 7 above.

Immediately after the second preclean the wafer is loaded into the Ultra High Vacuum (UHV) PVD system.

An optional in-situ surface clean can be executed in the UHV PVD chamber by heating wafer to about 300° C. in UHV and optionally exposing heated wafer surface to neutral (e.g. argon) plasma ions. Further, the cleaned surface of the thin, polysilicon layer 20 can be seasoned with a small amount (~5e14–1e16 $cm^{-2}$) of titanium (Ti) atoms to prevent presence of thick dielectric films between the thin, polysilicon layer 20 and the WN/W metallic conductor multilayer coating 21.

Titanium atoms quickly bind with oxygen and nitrogen present at the interface forming a conductive TiON compound in place of an insulating SiON compound. Titanium atoms can be sputtered from a Ti target using Ar plasma. The detailed method of forming multilayered conductive high-temperature-stable diffusion barrier including Ti surface seasoning is taught in (Clevenger et al application Ser. No. 10/411,710, cited above.

Next, a PVD of the very thin film of tungsten nitride (WN) is performed in a PVD chamber with a tungsten (W) target using a nitrogen/argon ($N_2$/Ar) gas plasma. Next, a PVD of elemental tungsten (W) is performed in the same chamber using an Ar plasma. The thickness of the elemental tungsten layer is selected to provide a desired sheet resistance of word lines and logic gate stacks. A typical word line/gate stack sheet resistance range is from about 2 Ω/sq to about 10 Ω/sq. This sheet resistance range corresponds to the tungsten layer thickness of from about 200 Å to about 800 Å. The chemical composition (W to N ratio) and thickness of the very thin WN film is selected to provide a diffusion-barrier property and prevent tungsten layer silicidation at a high junction activation temperature of from about 900° C. to about 1050° C. At the same time, contact resistance between polysilicon layers 20/18 and 20/12 and the WN/W metallic conductor multilayer coating 21 is less than about 300 Ω·$\mu^2$.

The preferred chemical composition of the very thin WN layer is such that the nitrogen to tungsten ratio is from about 0.3:1 to about 1.5:1, with 0.8:1 being more preferred. The preferred thickness of WN layer is from about 40 Å to about 160 Å, with 80 Å being preferred. Accordingly, the highly preferred thickness of the WN/W, metallic conductor multilayer coating 21 ranges from about 50 Å to about 100 Å of WN and from about 300 Å to about 500 Å of W thereabove. The plural depositions form the desired thicknesses by the in-situ deposition process without breaking ultra high vacuum and with the chemical composition (W to N ratio) of WN being controlled by changing the $N_2$/Ar ratio.

Step 9.

Figure 12:
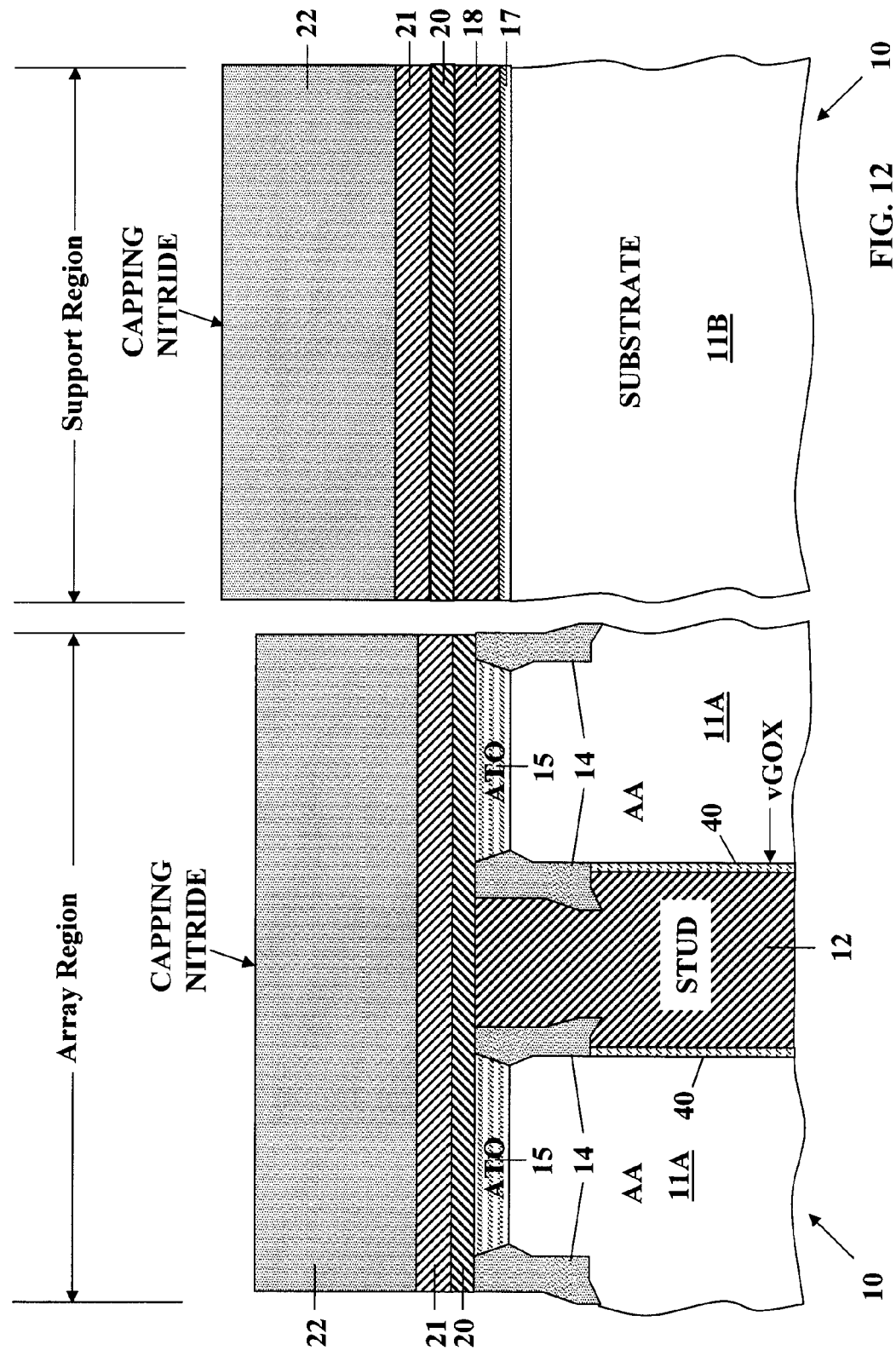

Referring to FIG. 12 the device of FIG. 11 is shown after deposition of a blanket Capping silicon Nitride (CN) layer 22 over the metallic conductor multilayer coating 21. Preferably, the CN layer 22 has been formed by CVD deposition with a target thickness of 1800 Å, within a range of about 1500 Å to about 2500 Å.

Step 10.

Figure 13:
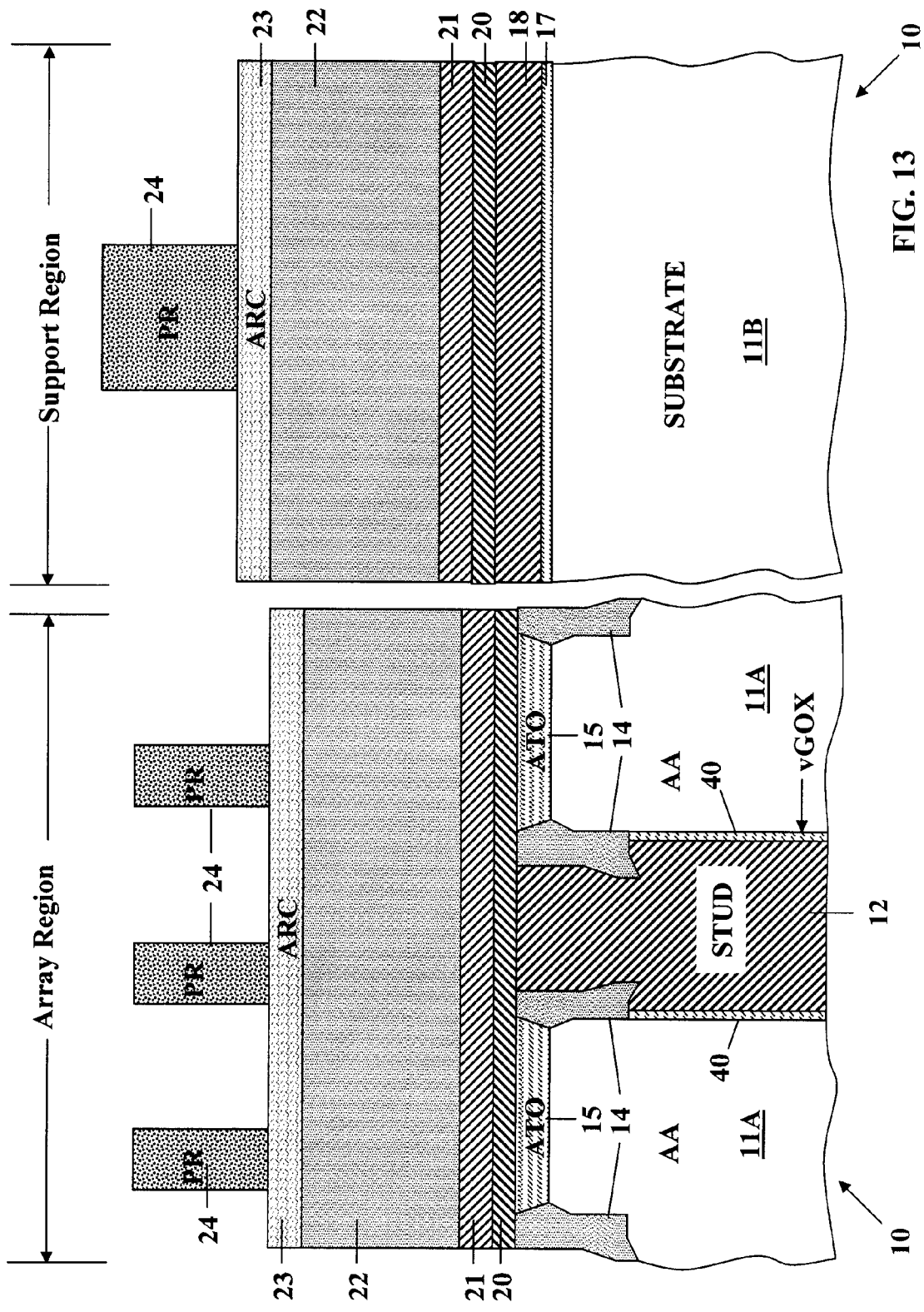

Referring to FIG. 13 the device of FIG. 12 is shown after gate patterning performed by the process steps as follows:

1. An ARC (Anti Reflection Coating) layer 23 is formed above the Capping silicon Nitride (CN) layer 22.

2. Deposit a blanket layer of photoresist 24 over the ARC layer 23.

3. Expose the blanket layer photoresist 24 to the patterns of the word lines 26A/26B/26C and the gate electrode stack 27 of FIG. 3.

4. Develop the photoresist 24 to form the patterns for the word lines 26A/26B/26C and the gate electrode stack 27 of FIG. 3 to pattern a hard mask.

Step 11.

Figure 14:
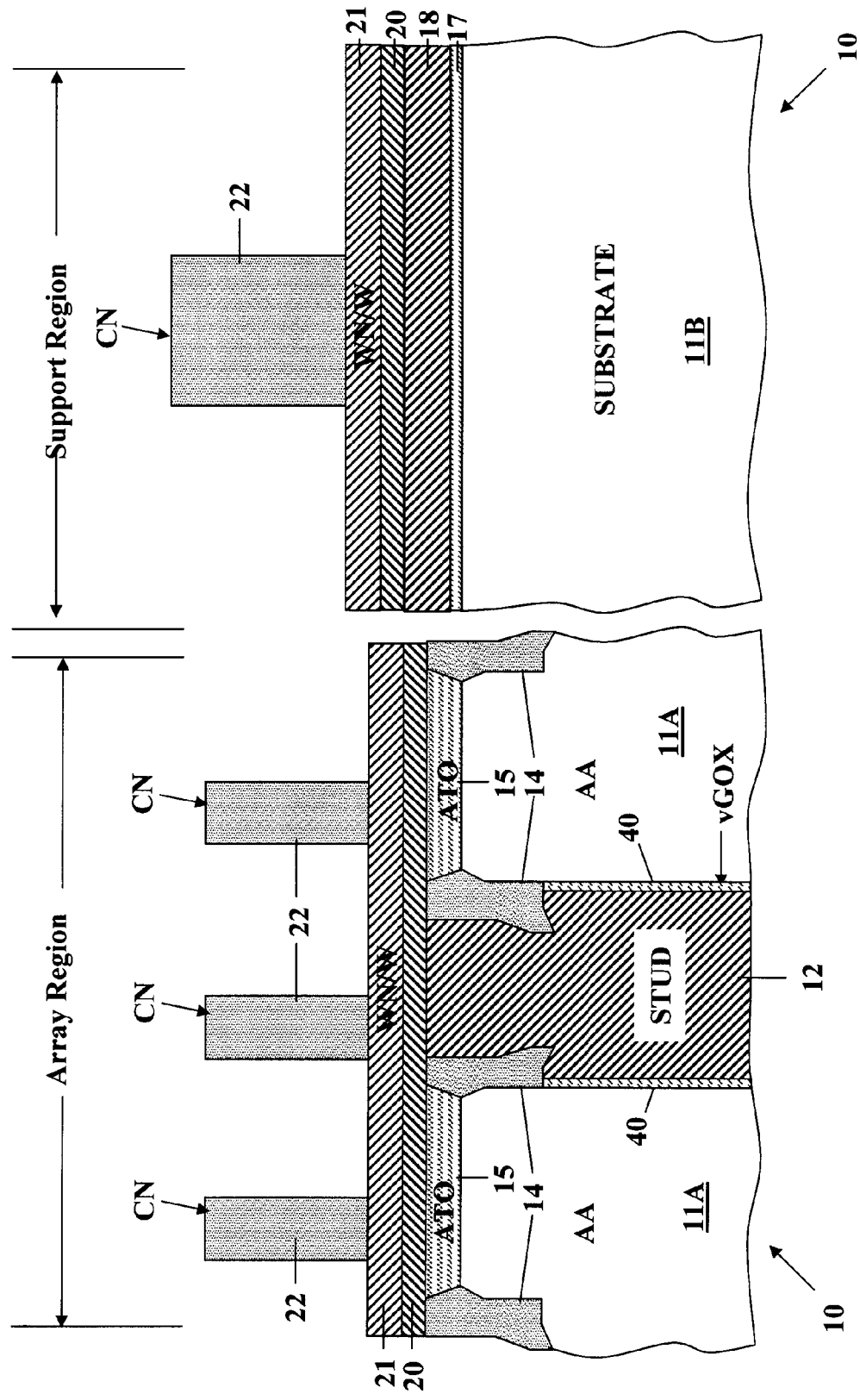

Referring to FIG. 14 the device of FIG. 13 is shown after the hard mask has been opened by an anisotropic RIE of the ARC 23 and the CN layer 22 in the pattern of the photoresist mask 24, which has been stripped in the conventional manner thereafter. The photoresist layer 24 and the ARC layer 23 can be optionally trimmed by adding a small isotropic component to otherwise anisotropic RIE process. Trimming is often employed in the art to produce sublithographic lines.

Step 12.

Figure 15:
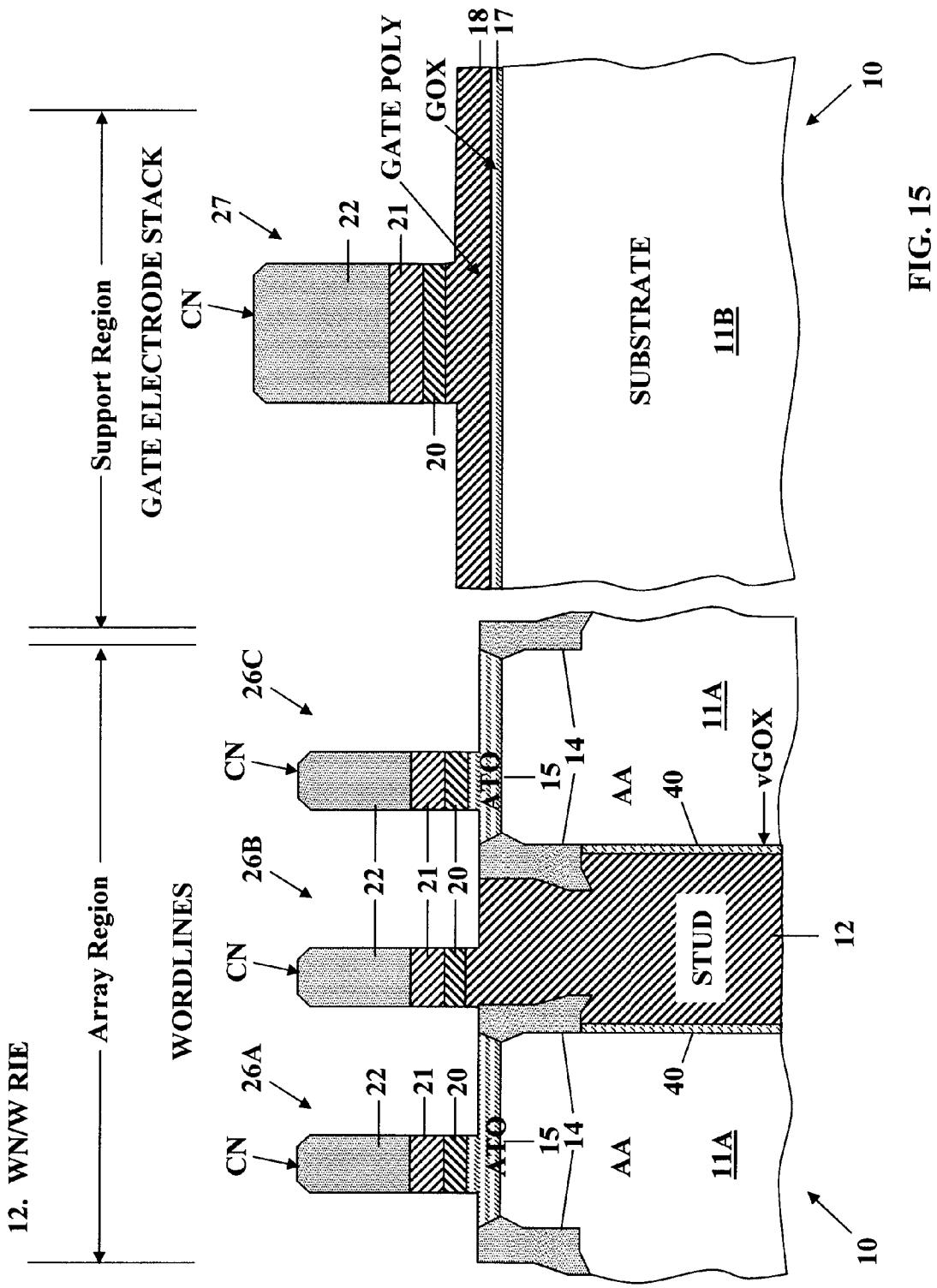

Referring to FIG. 15 the device of FIG. 14 is shown after WN/W RIE in which the CN layer 22 has been used as a mask to etch away layers aside therefrom including all of the exposed WN/W metallic conductor multilayer coating 21 and all of the exposed thin polysilicon layer 20 in both the array and support regions as well as etching away some of the exposed thick polysilicon layer 18 in the support region. The power was 300 W at the top electrodes and 75 W at bottom electrodes and it was a chlorine gas ($Cl_2$) based RIE. The etch rate of W to Si is almost 1:1 and W to silicon oxide is almost 20:1. i.e. there is no etch selectivity between W and Si but high selectivity on silicon oxide.

Step 13.

Figure 16:
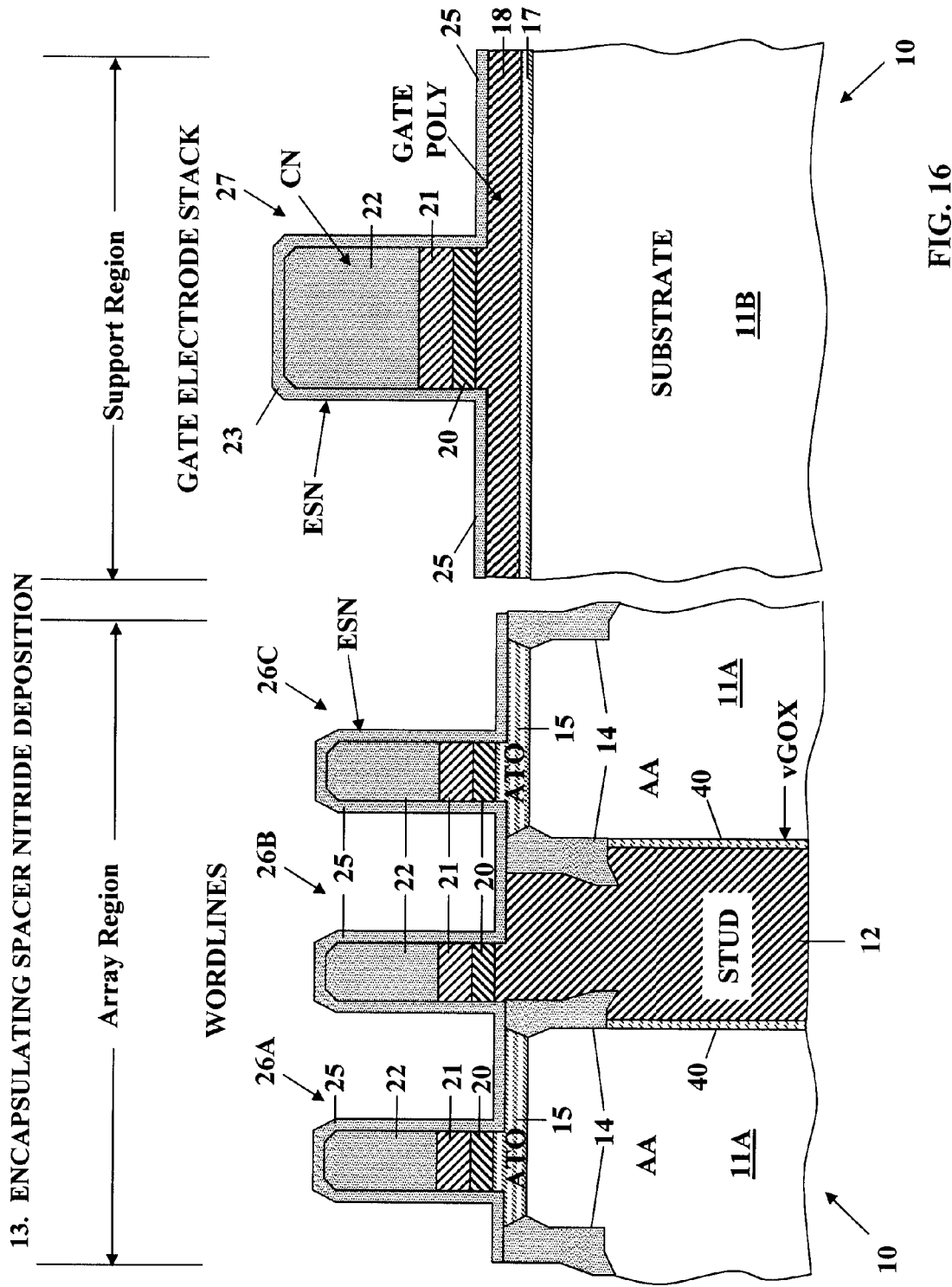

Referring to FIG. 16 the device of FIG. 15 is shown after deposition of an blanket encapsulating spacer layer 25 composed of silicon nitride using normal furnace CVD deposition at a temperature of about 700° C. with a thickness of about 120 Å.

Step 14.

Figure 17:
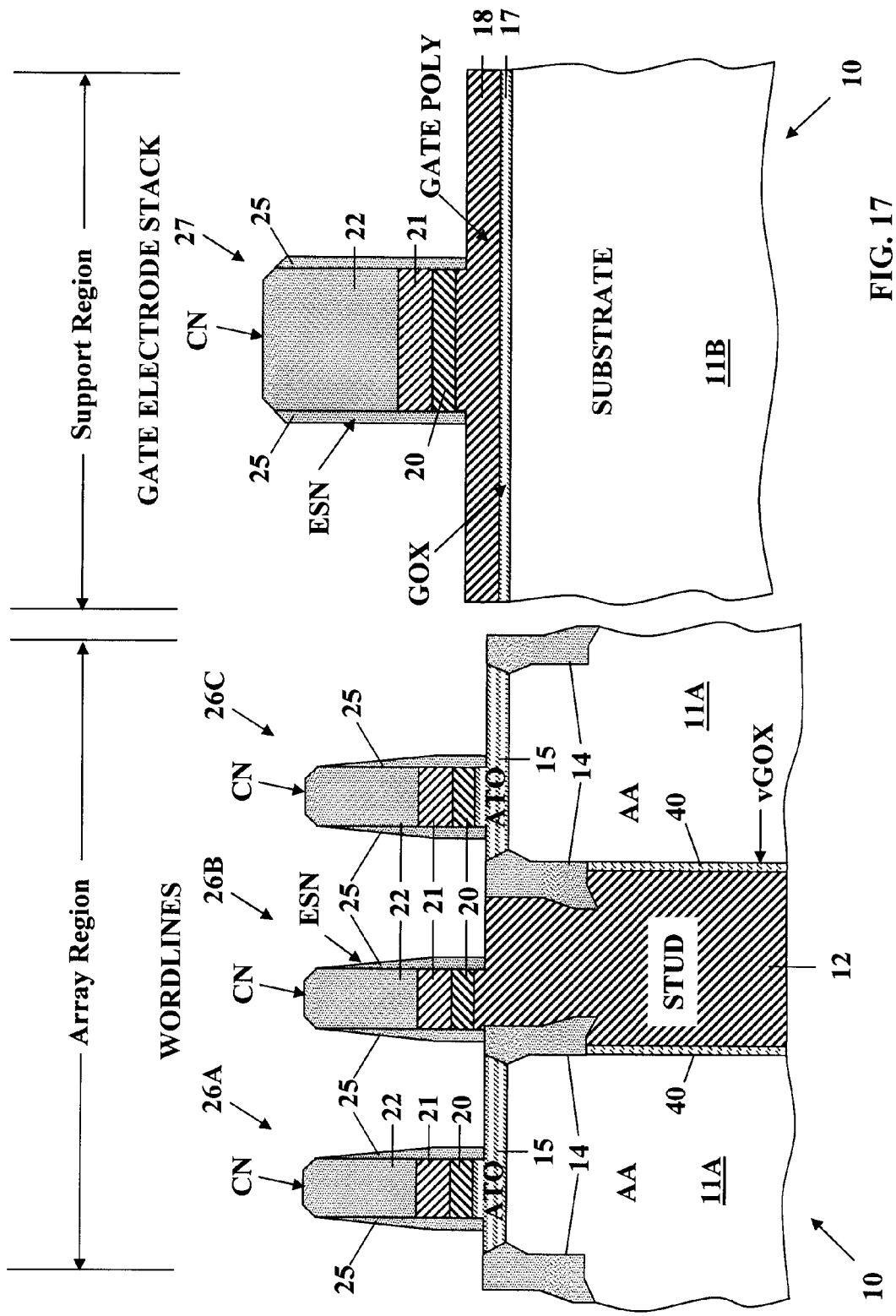

Referring to FIG. 17 the device of FIG. 16 is shown after encapsulating spacer RIE which etches back the blanket spacer layer 25 composed of silicon nitride to form sidewall spacers as will be well understood by those skilled in the art.

Step 15.

Figure 18:
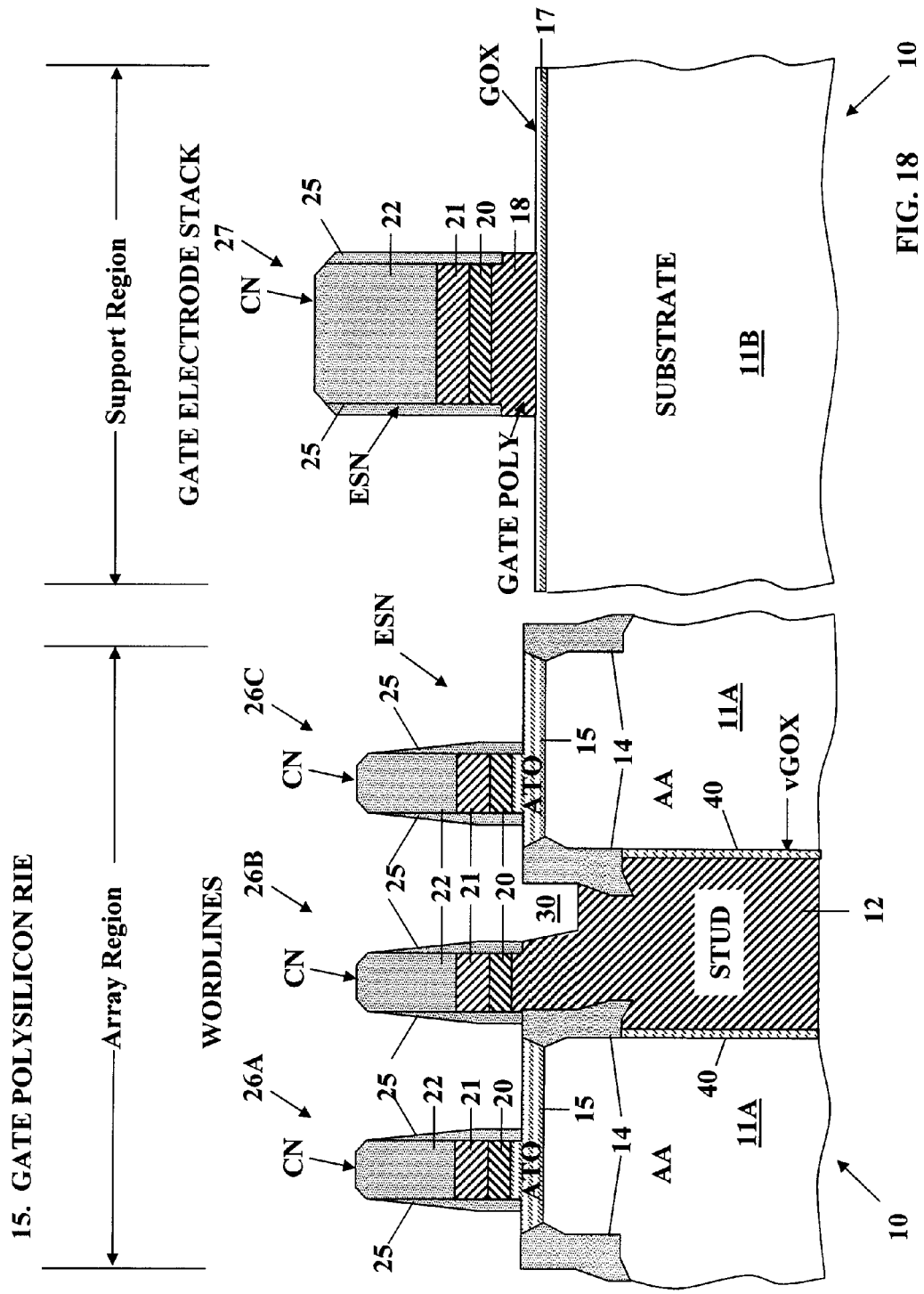

Referring to FIG. 18 the device of FIG. 17 is shown after an anisotropic RIE process has been used to remove the gate polysilicon layer 18 aside from the sidewall spacers 25 in the support region, as will be well understood by those skilled in the art.

Figure 1:
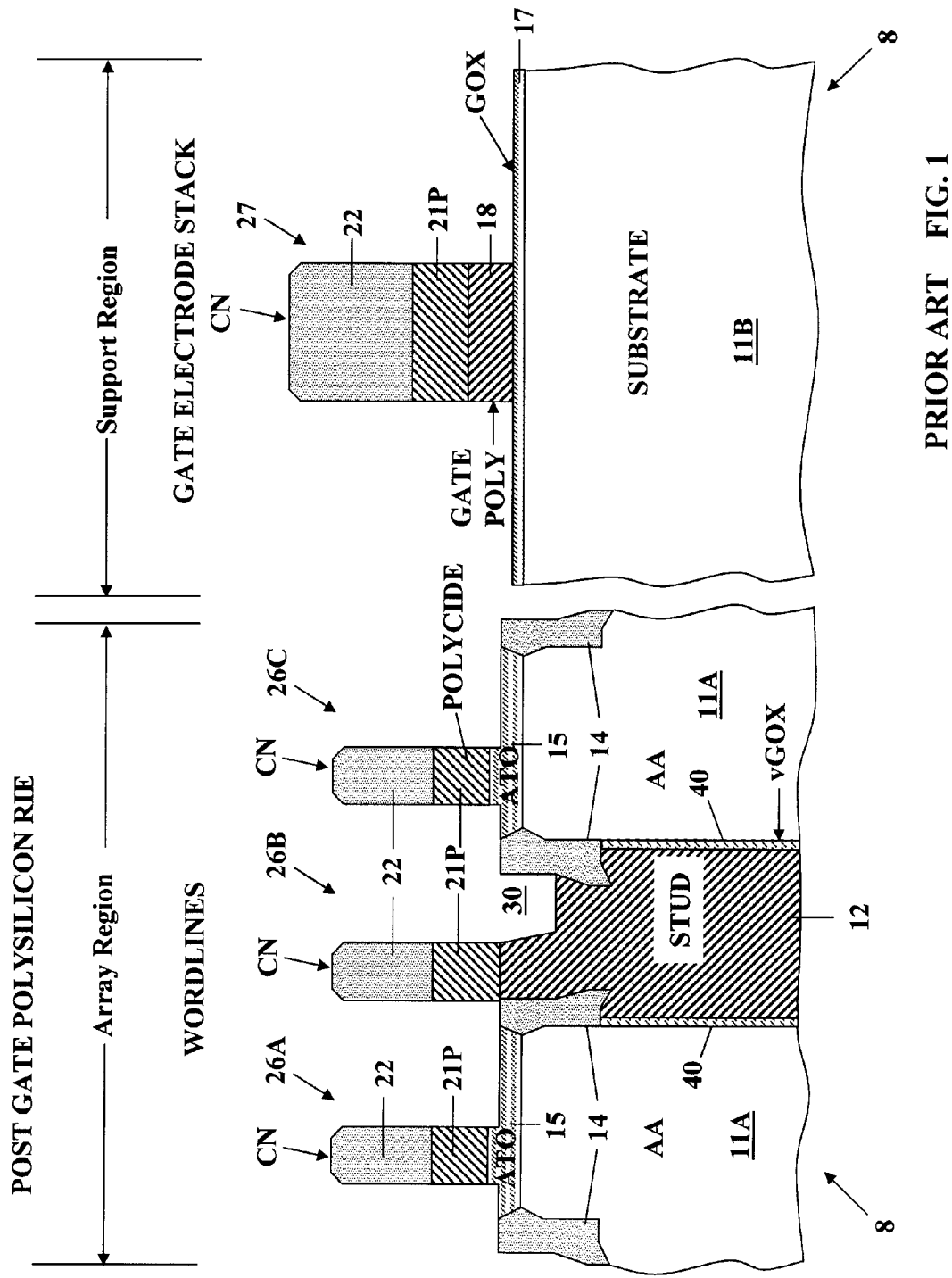
FIG. 1 shows a sectional view of a prior art DRAM device.

The applicants have built semiconductor structures shown in FIG. 3 following process steps described above in conjunction with FIGS. 4–18. Several important findings are presented below and compared to the prior art shown in FIGS. 1–2.

The applicants have found that the thickness of polysilicon layers 18 and 20 in the support region and the amount of the overetch of metallic conductor multilayer coating 21 is directly related to the planar gate dielectric 17 punch through phenomenon and related substrate 11B erosion.

Support Punch Through

Figure 19:
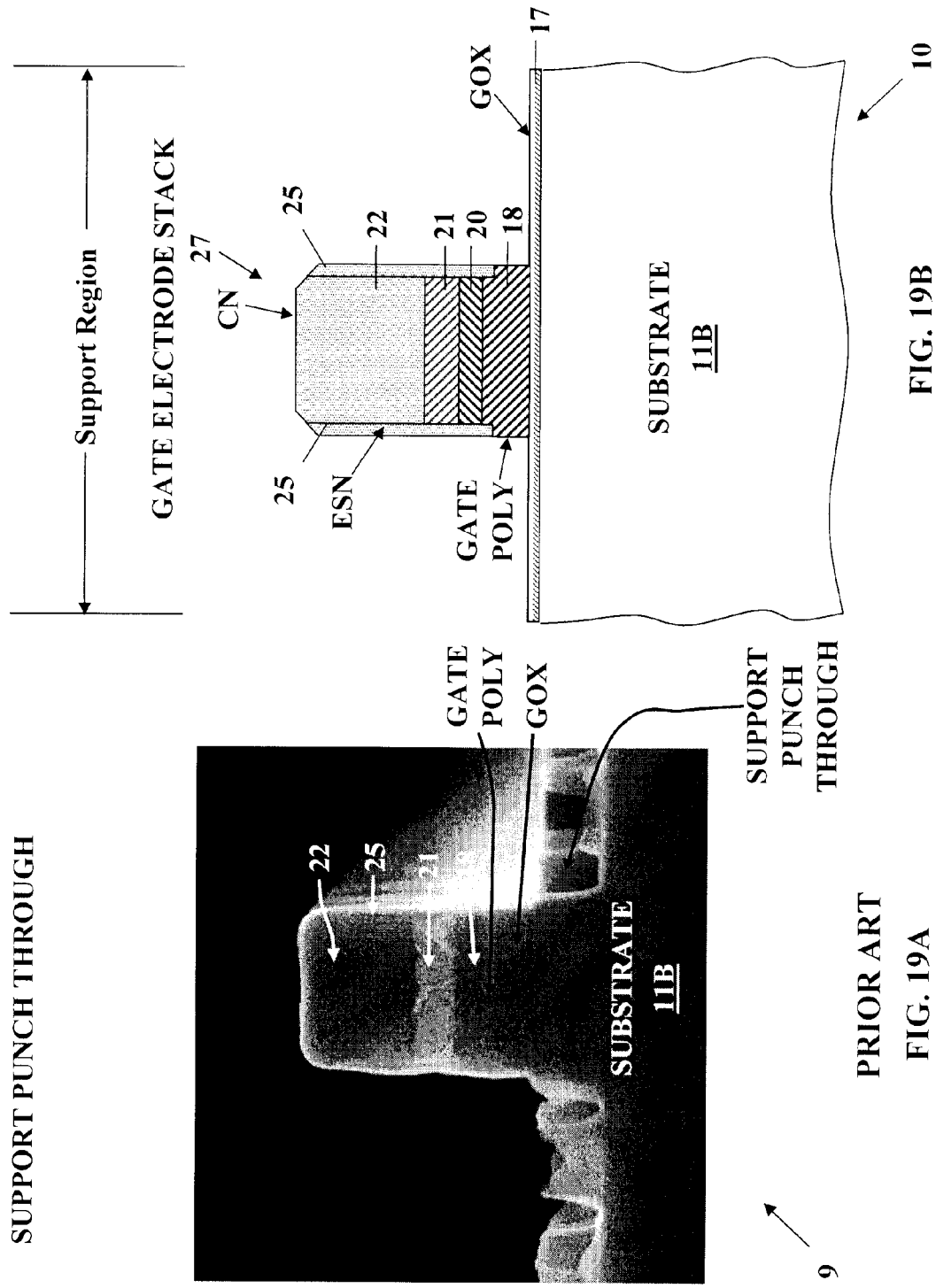
FIG. 19A is a SEM micrograph of showing prior art type a gate electrode stack of the kind shown in FIG. 2 which shows support punch through adjacent to the gate electrode stack.
FIG. 19B which shows the gate electrode stack of the device of FIG. 18 is presented side by side with FIG. 19A.

FIG. 19A shows prior art type of gate electrode stack 27 of a device 9 of the kind shown in FIG. 2 formed on a substrate 11B which includes a GOX layer upon which gate polysilicon layer 18 has been formed. Above the substrate 11B is a gate poly layer 18, a W/WN layers 21, a CN layer 22 and a sidewall spacer 25 of is a gate electrode stack 27. The support punch through is shown to the right side of the GOX and the gate poly. FIG. 19B shows the gate electrode stack of the device of FIG. 18 presented side by side with FIG. 19A.

The punch through phenomenon and substrate erosion is shown in FIG. 19A via a Scanning Electron Microscope (SEM) micrograph of a cross sectional view of a support region with 150,000 times magnification.

The combined thickness of polysilicon layers 18 and 20 is about two times larger than that of the metallic conductor multilayer coating 21. The amount of the metallic conductor multilayers layers 21 overetch is about 200%. As evident from FIG. 19A, such selection of layer 18 and 20 thickness and amount of the metallic conductor multilayer coating 21 overetch leads to a severe gate dielectric punch through and subsequent substrate erosion during polysilicon etching. Accordingly, in order to avoid the punch through phenomenon in the support, the combined thickness of polysilicon layers 18 and 20 should be larger than the thickness of metallic conductor multilayer coating 21 multiplied by the overetch factor. Small overetch factors are highly desirable because they allow for thinner layers 18 and 21, smaller overall gate stack height, and, consequently, reduced capacitance and stack aspect ratio of the gate stack.

The applicants have also found that a reduction of the metallic conductor multilayer coating 21 overetch can lead to inadvertent electrical shorts due to an incomplete removal of conductive material around non-conformal topographical features such as steps.

Figure 20:
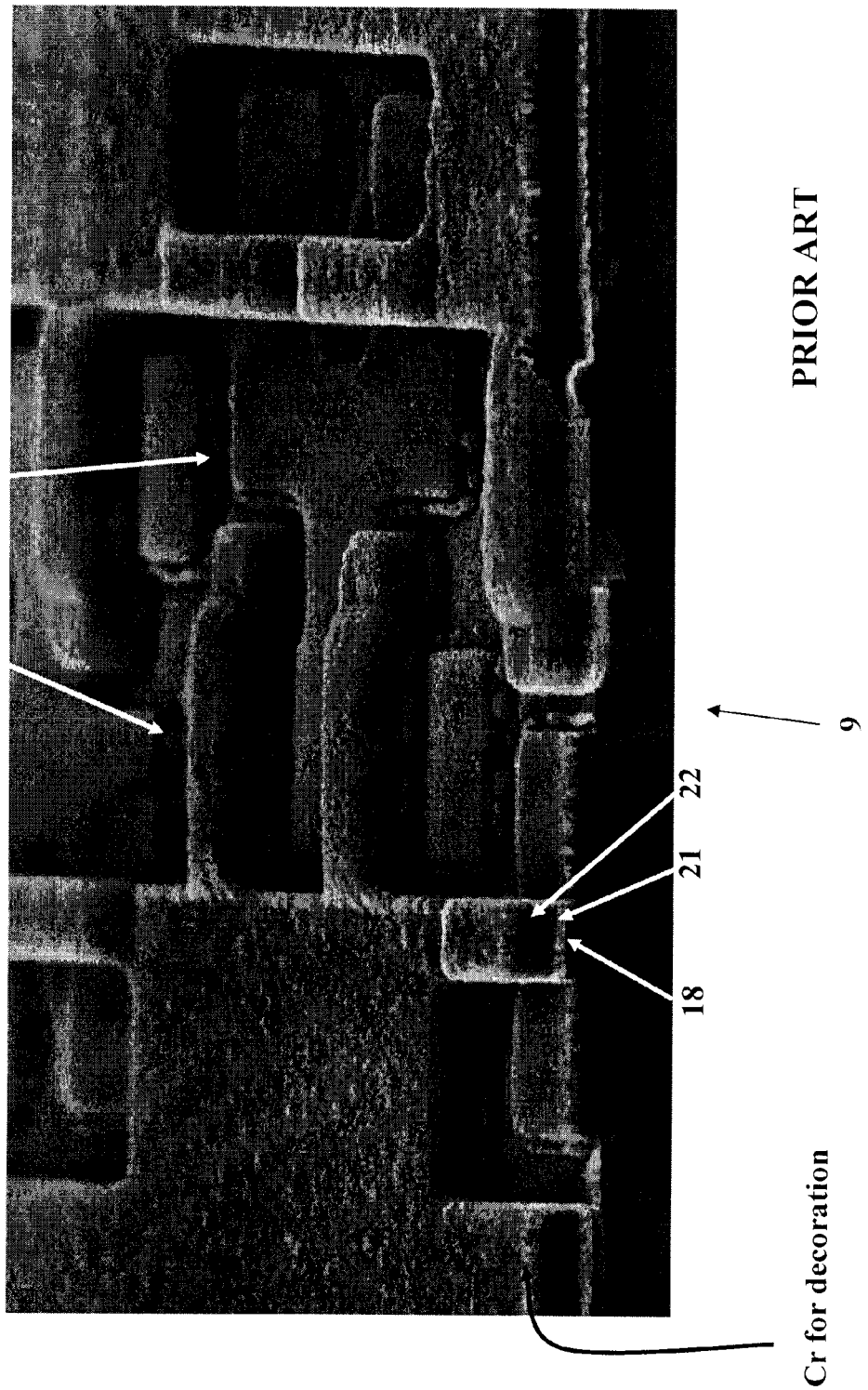
FIG. 20 is a SEM micrograph of an example of a prior art type of device of the kind shown in FIG. 2 wherein polysilicon residue is left by an insufficient overetch due to a shorter polysilicon RIE.

FIG. 20 is a SEM micrograph showing a plain tilted view of an example of a prior art type of gate electrode stack 9 of FIG. 2 with polysilicon residue left by an insufficient overetch due to a shorter RIE overetch. FIG. 20 shows the gate polysilicon layer 18, WN/W layers 21 and CN layer 22 and the chromium (Cr) provided for decoration.

FIG. 20 provides a SEM micrograph with a tilted view of a support region with 25,000 times magnification. The combined thickness of polysilicon layers 18 and 20 is about two times larger than that of the metallic layer 21. The amount of the metallic conductor multilayer coating 21 overetch is about 50%. As evident from FIG. 20, there is no apparent gate dielectric punch through or substrate erosion, however, there is an apparent residue of conductive material around topographical features. Accordingly, the preferred amount of overetch should be larger than 50% to avoid inadvertent electrical shorts.

A highly preferred amount of the overetch is from about 75% to about 100%.

Combining aforementioned findings, the combined thickness of polysilicon layers 18 and 20 should be larger than the thickness of metallic layer 21, preferably, two times larger.

Figure 21:
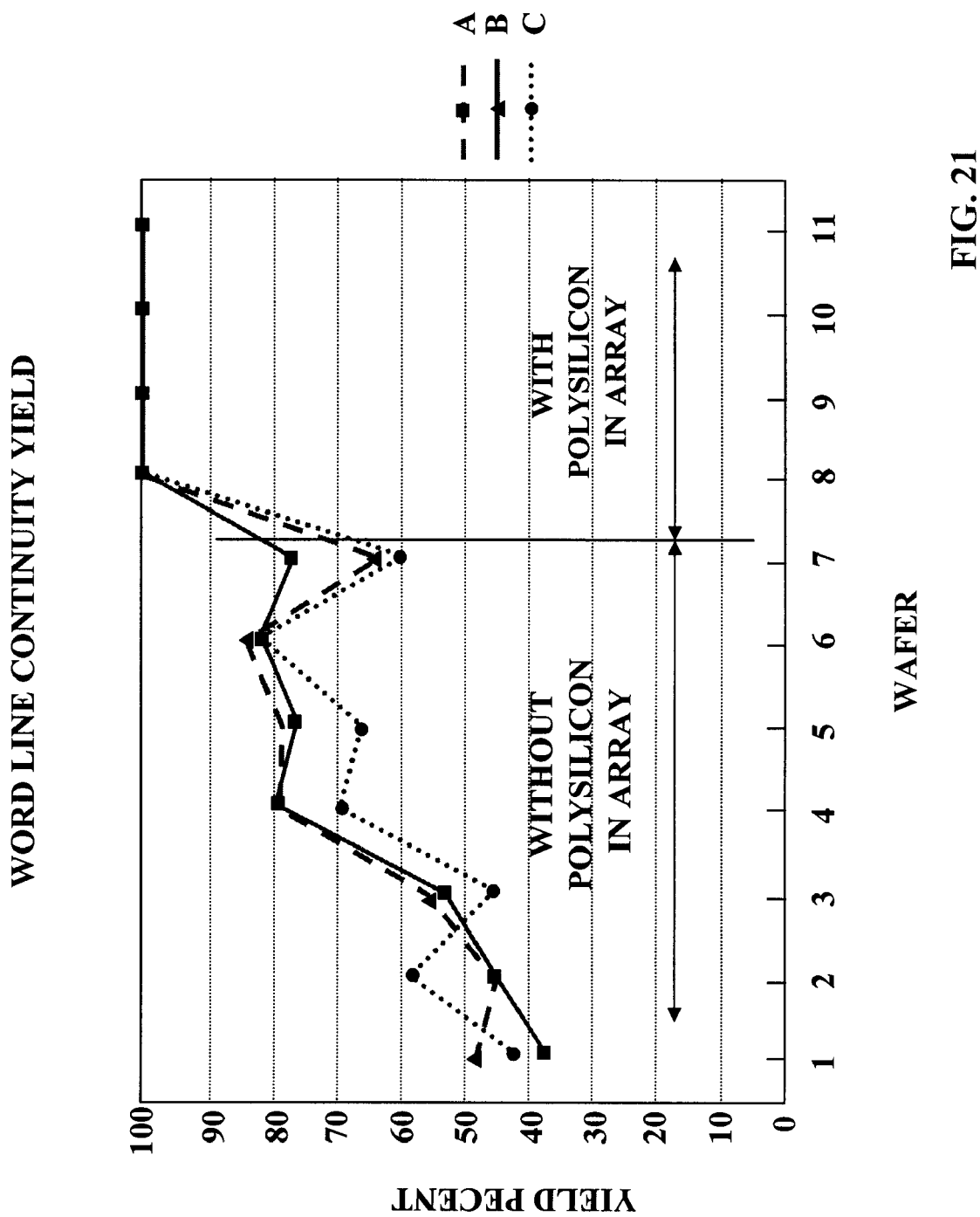
FIG. 21 shows a yield chart for word line electrical continuity.

FIG. 21 shows a yield chart for word line electrical continuity. A yield of 100% means that all tested word lines do not have opens. As evident from FIG. 21, inclusion of thin conformal amorphous silicon layer 20 into the word line completely eliminates word line opens as compared to word line structures shown in FIG. 2 (Prior Art) which have about 20–60% of electrical opens.

While this invention has been described in terms of the above specific embodiment(s), those skilled in the art will recognize that the invention can be practiced with modification within the spirit and scope of the appended claims, i.e. that changes can be made in form and detail, without departing from the spirit and scope of the invention. Accordingly all such changes come within the purview of the present invention and the invention encompasses the subject matter of the following claims.

What is claimed is:

1. A method of forming an integrated circuit device including at least one semiconductor memory array region and logic circuits including a support region including the steps as follows:
    forming a thick polysilicon layer having a first thickness over both said array region where word lines are located and over said support region where said logic circuits are located;
    then removing said thick polysilicon layer only from said array region;
    then depositing a thin polysilicon layer over both said array region and said support region, with said thin polysilicon layer having a second thickness substantially less than said first thickness, and with said thin polysilicon layer being formed on said thick polysilicon layer in said support region;
    then depositing a metallic conductor coating including at least an elemental metal layer portion over said thin polysilicon layer; and
    then forming word lines in said array region from said thin polysilicon layer and forming gate electrodes in said support region from said thick polysilicon layer and said thin polysilicon layer above said thick polysilicon layer.

2. A method of forming an integrated circuit device including at least one semiconductor memory array region and logic circuits including a support region including the steps as follows:
    forming a sacrificial polysilicon layer over said array region followed by formation of a gate oxide layer over said device;
    forming a thick polysilicon layer in both said array region where word lines are located and said support region where the logic circuits are located;
    removing said thick polysilicon layer only over the array region and removing the sacrificial polysilicon layer;
    then precleaning the device;
    then depositing a thin polysilicon layer in both said array region and said support region,
    then depositing a metallic conductor coating including at least an elemental metal layer portion over said thin polysilicon layer; and
    then forming word lines and gate electrodes in said array region and in said support region respectively.

3. The method of claim 2 including forming a barrier layer between said thin polysilicon layer and said metal layer.

4. The method of claim 1 wherein said thin polysilicon layer comprises amorphous silicon.

5. The method of claim 4 wherein the method begins with forming of a blanket sacrificial polysilicon layer over said array region followed by forming of a blanket gate oxide layer over said device.

6. The method of claim 5 including forming a barrier layer between said thin polysilicon layer and said metallic conductor coating.

7. The method of claim 2 wherein a gate oxide layer is formed over said device after formation of said sacrificial polysilicon layer.

8. The method of claim 4 including forming a gate oxide layer over the device after formation of the sacrificial polysilicon layer.

9. The method of claim 1 including forming a capping silicon nitride layer over said metal layer before forming word lines and gate electrodes in said array region and in said support region.

10. The method of claim 9 including:
   forming said integrated circuit device on a semiconductor substrate with a polysilicon stud in a trench in said semiconductor substrate under an electrically conductive word line with said stud being electrically insulated from said substrate by dielectric material on sidewalls of said trench and with an Array Top Oxide (ATO) layer formed above said substrate aside from said polysilicon stud;
   forming word lines in said array region;
   forming gate electrodes in said support region; and
   forming sidewall spacers on sidewalls thereof.

11. The method of claim 1 including performing the step of precleaning prior to the step of depositing said thin polysilicon layer in both said array region and said support region.

12. A method of forming an integrated circuit device including at least one semiconductor memory array region and logic circuits including a support region including the steps as follows:
   forming a thick polysilicon layer having a first thickness of greater than or equal to 500Å over both said array region where word lines are located and over said support region where said logic circuits are located;
   then removing said thick polysilicon layer only from said array region;
   then depositing a thin polysilicon layer over both said array region and over said support region, said thin polysilicon layer having a second thickness of less than or equal to 300Å;
   then depositing a metallic conductor coating including at least an elemental metal layer portion over said thin polysilicon layer; and
   then forming word lines in said array region from said thin polysilicon layer and forming gate electrodes in said support region from said thick polysilicon layer and said thin polysilicon layer thereabove.

13. The method of claim 12 including forming a sacrificial polysilicon layer over the array region prior to formation of said thick polysilicon layer.

14. The method of claim 12 including forming a barrier layer between said thin polysilicon layer and said metal layer.

15. The method of claim 12 wherein said thin polysilicon layer comprises amorphous silicon.

16. The method of claim 15 beginning with forming of a blanket sacrificial polysilicon layer over said array region followed by forming of a blanket gate oxide layer over said device.

17. The method of claim 16 including forming a barrier layer between said thin polysilicon layer and said metallic conductor coating.

18. The method of claim 12 including performing a precleaning step prior to the step of depositing said thin polysilicon layer in both said array region and said support region.

19. The method of claim 18 including performing a second precleaning step prior to the step of depositing said metallic conductor coating over said thin polysilicon layer.

20. The method of claim 19 wherein formation of said metallic conductor coating over said thin polysilicon layer comprises
   seasoning said thin polysilicon layer with titanium atoms after said second precleaning step;
   depositing a tungsten nitride (WN) with a thickness from about 40Å to about 150Å; and then depositing a tungsten (W) with a thickness from about 300Å to about 500Å thereabove.

* * * * *